(12) United States Patent
DeLano et al.

(10) Patent No.: US 12,201,975 B2
(45) Date of Patent: Jan. 21, 2025

(54) DEVICE INCLUDING A HYDROPHILIC, NON-IONIC COATING FOR SIZE EXCLUSION CHROMATOGRAPHY

(71) Applicant: Waters Technologies Corporation, Milford, MA (US)

(72) Inventors: Mathew H. DeLano, Needham, MA (US); Matthew Lauber, North Smithfield, RI (US); Andrew Wyatt Schmudlach, Ashland, MA (US); Daniel P. Walsh, Danvers, MA (US); Yeliz Tunc Sarisozen, Westford, MA (US); Jonathan Belanger, Whitinsville, MA (US); Darryl W. Brousmiche, Grafton, MA (US); Andrew Bates-Harrison, West Roxbury, MA (US); Nicole L. Lawrence, Stafford Springs, CT (US)

(73) Assignee: Waters Technologies Corporation, Milford, MA (US)

(*) Notice: Subject to any disclaimer, the term of this patent is extended or adjusted under 35 U.S.C. 154(b) by 440 days.

(21) Appl. No.: 17/502,483

(22) Filed: Oct. 15, 2021

(65) Prior Publication Data

US 2022/0118443 A1 Apr. 21, 2022

Related U.S. Application Data

(60) Provisional application No. 63/092,789, filed on Oct. 16, 2020.

(51) Int. Cl.
*G01N 30/56* (2006.01)
*B01L 3/00* (2006.01)
(Continued)

(52) U.S. Cl.
CPC ...... *B01L 3/502707* (2013.01); *C09D 143/04* (2013.01); *B01L 3/502761* (2013.01);
(Continued)

(58) Field of Classification Search
CPC .......... B01L 3/502707; B01J 20/28004; B01J 20/3276; C09F 5/00
See application file for complete search history.

(56) References Cited

U.S. PATENT DOCUMENTS 4,708,782 A * 11/1987 Andresen ......... G01N 27/44756
210/198.2
5,470,463 A * 11/1995 Girot .................. B01J 20/28004
502/402
(Continued)

FOREIGN PATENT DOCUMENTS

WO 200032044 A1 6/2000
WO 200168240 A2 9/2001
(Continued)

OTHER PUBLICATIONS

Kanavarioti et al. "HPLC methods for purity evaluation of man-made single-stranded RNAs." Nature. 9(2019): 1019.
(Continued)

*Primary Examiner* — Dah-Wei D. Yuan
*Assistant Examiner* — Andrew J Bowman
(74) *Attorney, Agent, or Firm* — WOMBLE BOND DICKINSON (US) LLP; Deborah M. Vernon; Scott R. Breining

(57) ABSTRACT

The present disclosure is directed to a coating process for chromatographic surfaces. Embodiments of the present disclosure feature a two-step, vapor-liquid phase organosilane deposition method for creating a hydrophilic, non-ionic surface in a chromatographic system.

20 Claims, 28 Drawing Sheets

(51) Int. Cl.
*C09D 143/04* (2006.01)
*C23C 16/56* (2006.01)
*G01N 30/60* (2006.01)

(52) U.S. Cl.
CPC ..... *B01L 2200/12* (2013.01); *B01L 2300/165* (2013.01); *C23C 16/56* (2013.01); *G01N 30/6095* (2013.01)

(56) References Cited

U.S. PATENT DOCUMENTS

| | | | |
|---|---|---|---|
| 5,856,192 A | 1/1999 | Bloch | |
| 6,121,608 A * | 9/2000 | Takada | H01J 49/165 250/288 |
| 6,686,035 B2 | 2/2004 | Jiang et al. | |
| 2009/0206034 A1 * | 8/2009 | Nakajima | B01J 20/3276 528/34 |
| 2015/0283307 A1 * | 10/2015 | Smith | C23C 16/30 556/487 |
| 2020/0215457 A1 | 7/2020 | DeLano et al. | |

FOREIGN PATENT DOCUMENTS

| | | |
|---|---|---|
| WO | 2007081387 A1 | 7/2007 |
| WO | 2017210223 A1 | 12/2017 |
| WO | 2019053693 A1 | 3/2019 |
| WO | 2019154758 A1 | 8/2019 |

OTHER PUBLICATIONS

Wyndham et al. "Characterization and Evaluation of C18 Hplc Stationary Phases Based on Ethyl-Bridged Hybrid Organic/Inorganic Particles." Anal. Chem. 75.24(2003): 6781-6788.
International Search Report and Written Opinion issued in International Application No. PCT/IB2021/059534 dated Mar. 10, 2022.

* cited by examiner

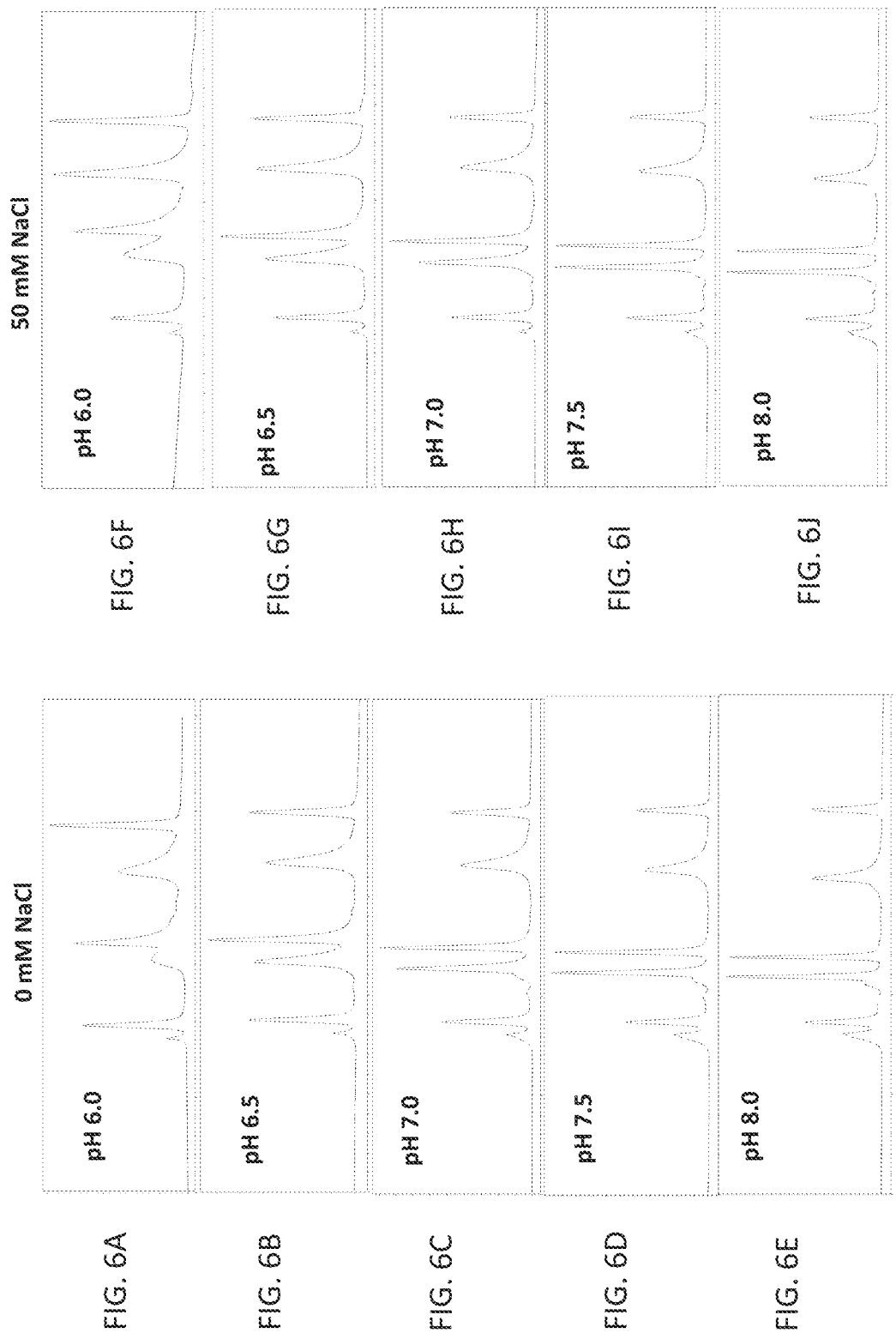

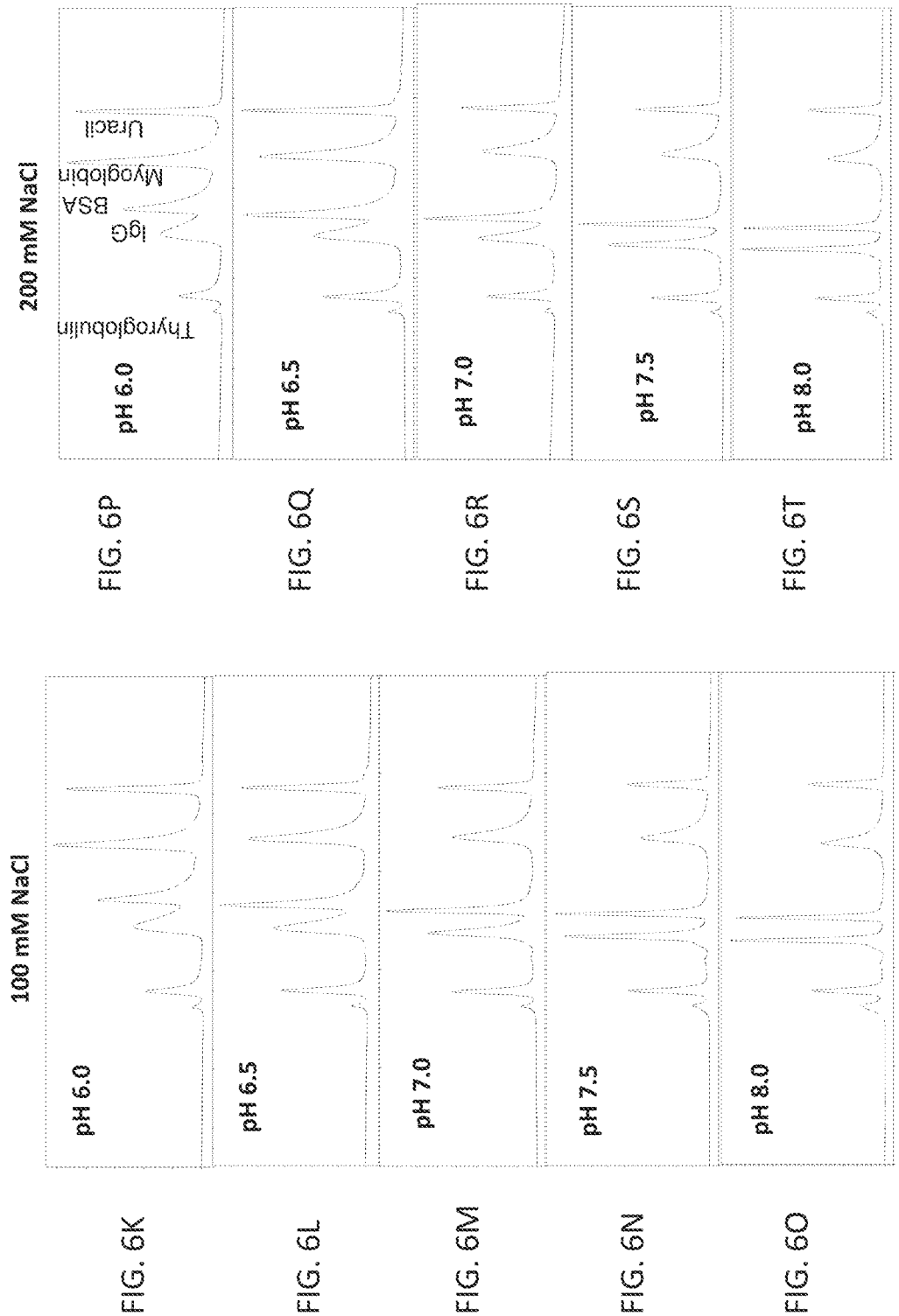

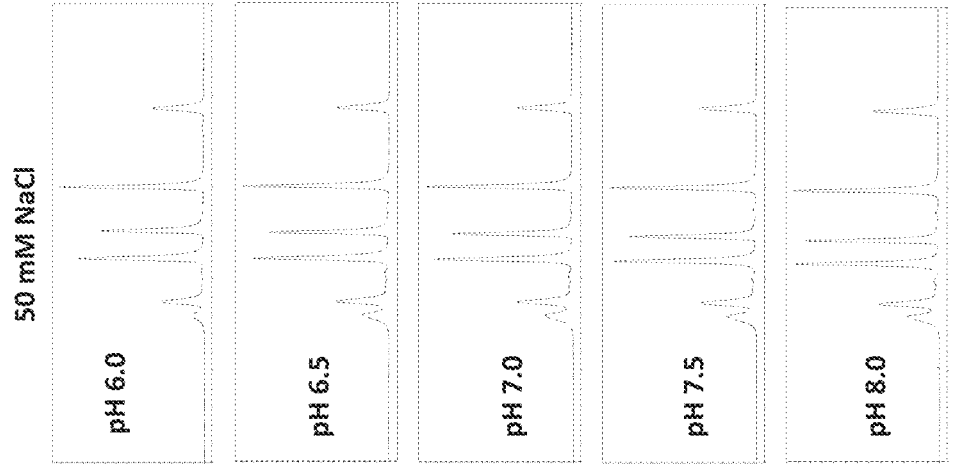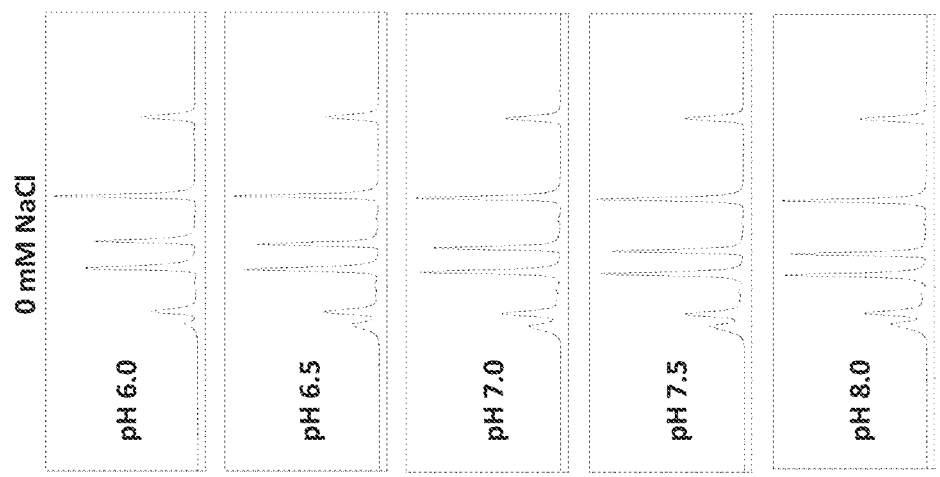

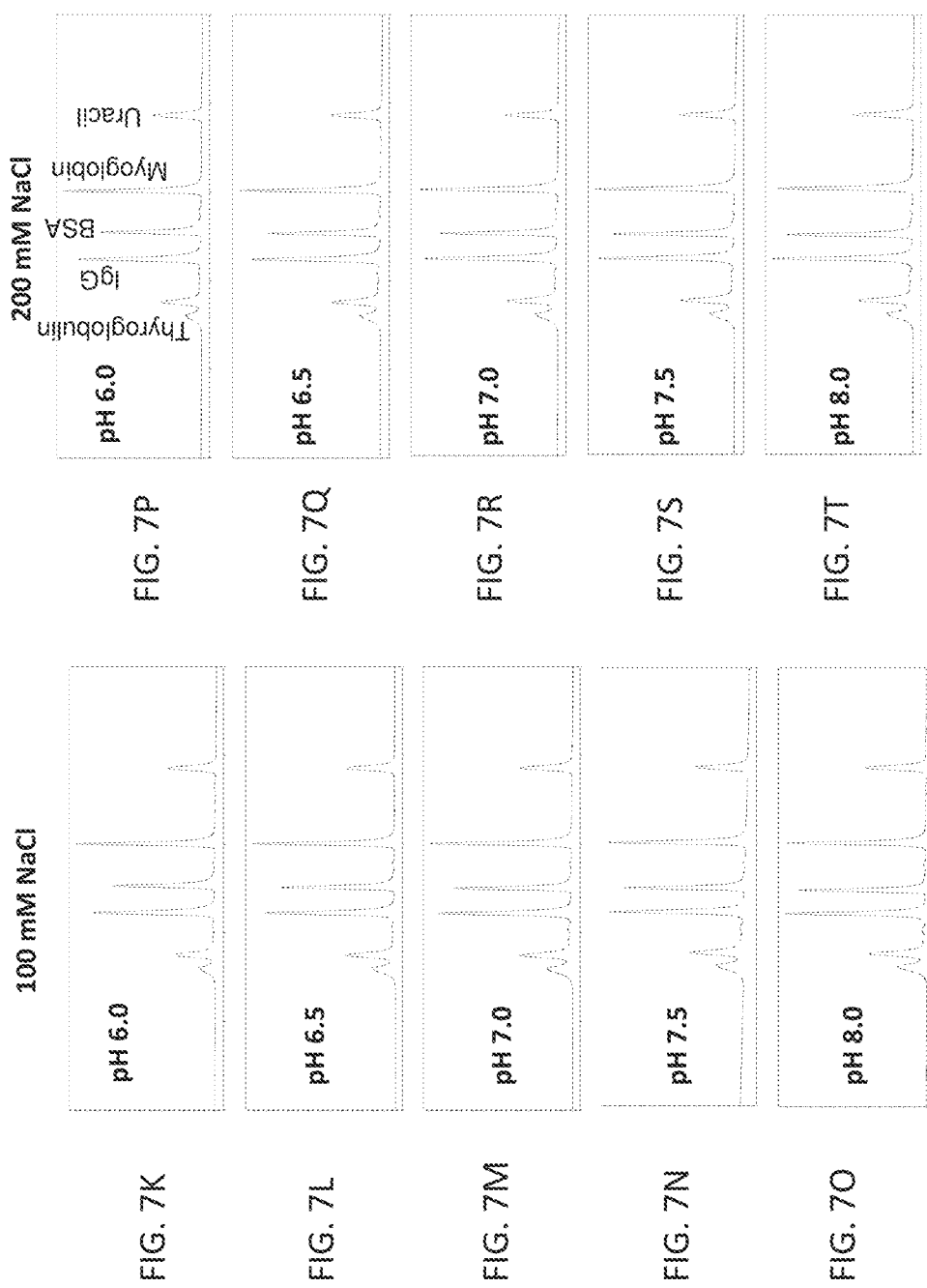

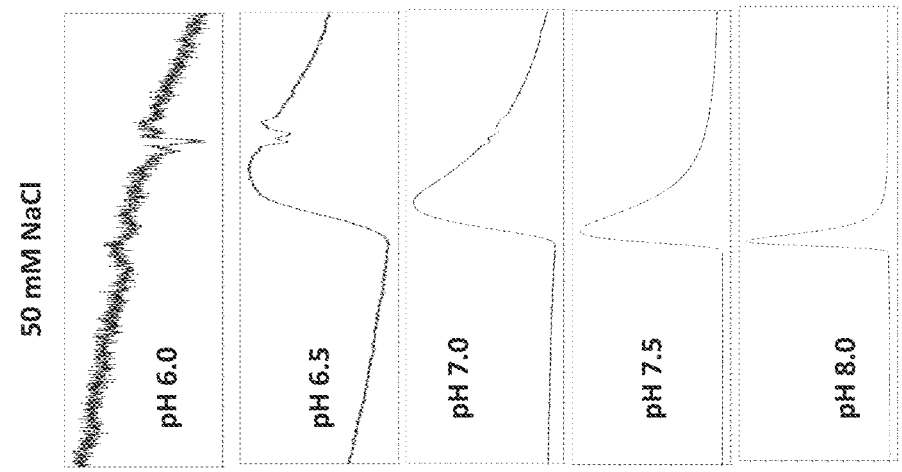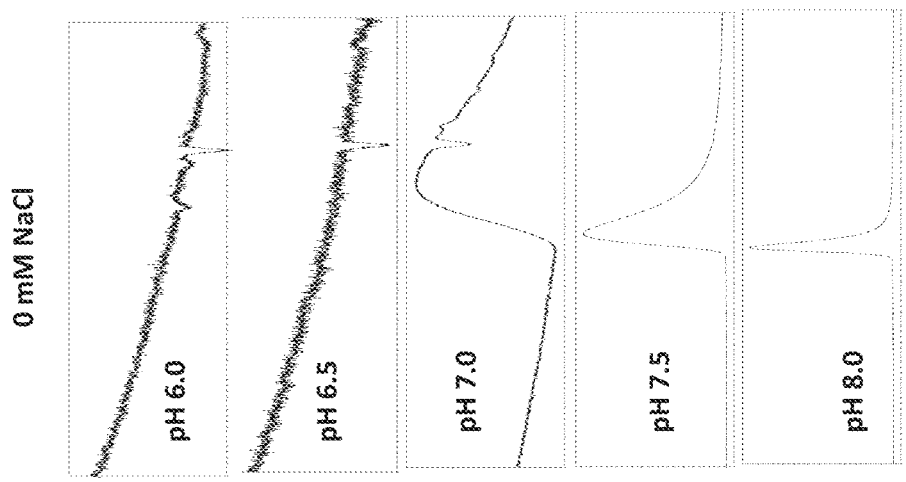

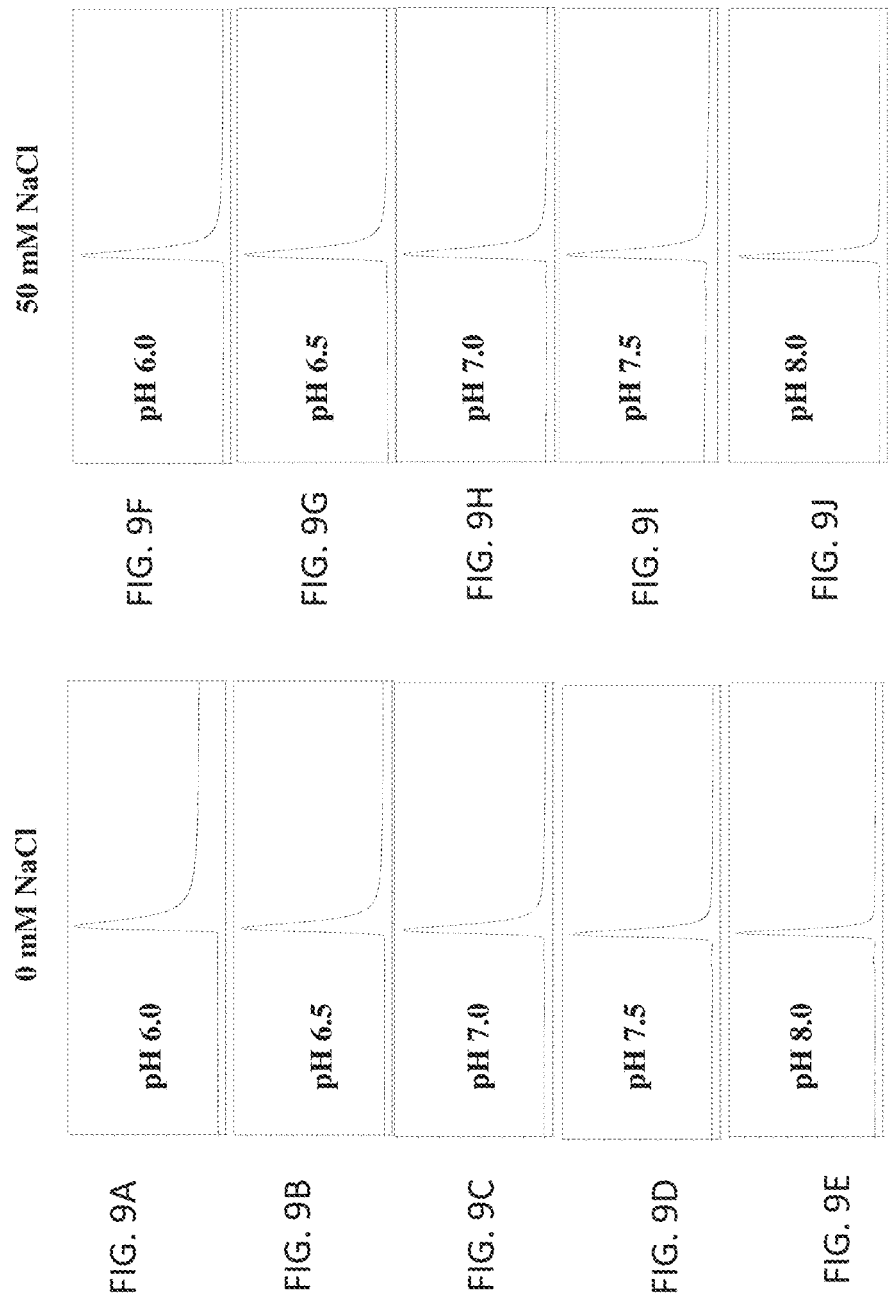

FIG. 9K
FIG. 9L
FIG. 9M
FIG. 9N
FIG. 9O 100 mM NaCl

FIG. 9P
FIG. 9Q
FIG. 9R
FIG. 9S
FIG. 9T 200 mM NaCl

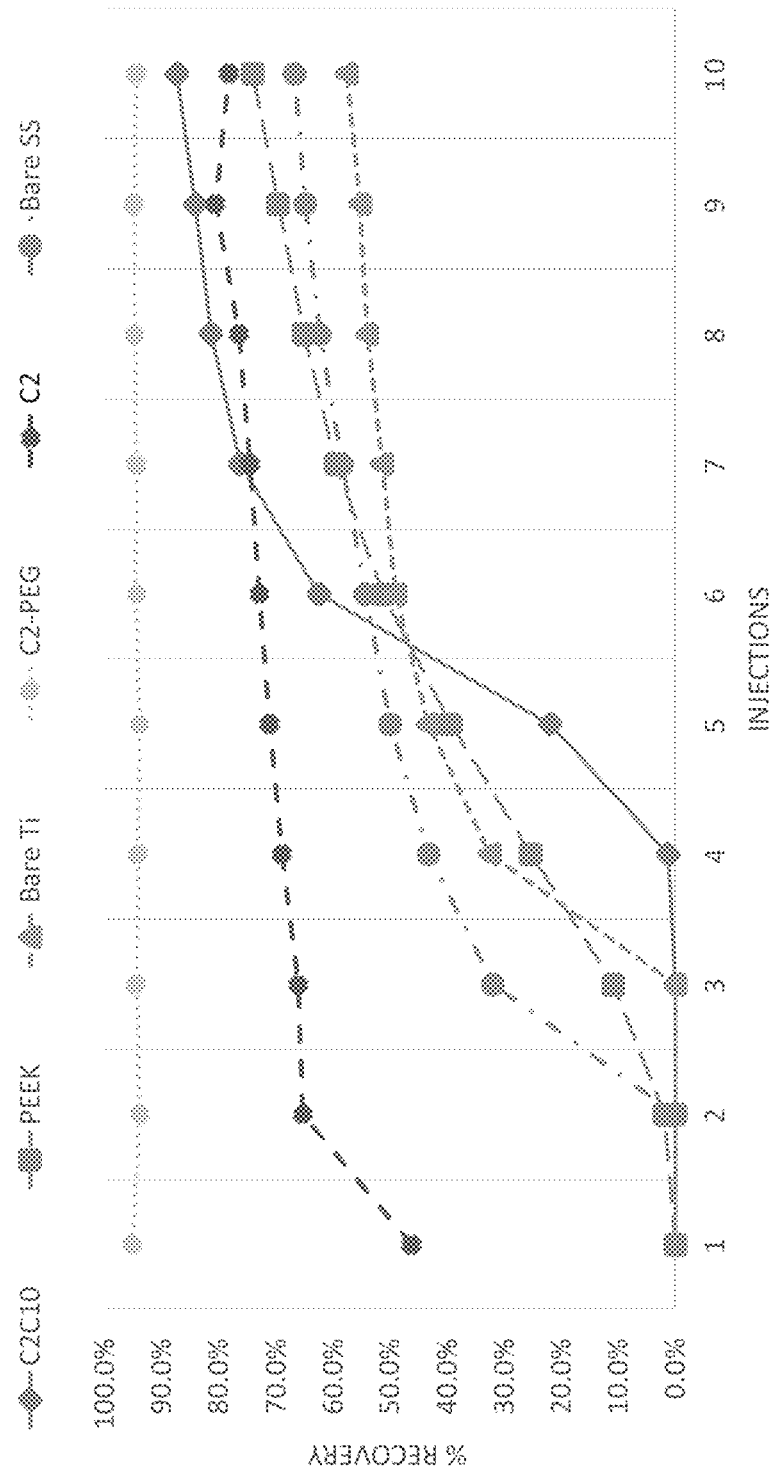

DEVICE INCLUDING A HYDROPHILIC, NON-IONIC COATING FOR SIZE EXCLUSION CHROMATOGRAPHY

CROSS-REFERENCE TO RELATED APPLICATIONS

This application claims priority and benefit to U.S. Provisional Patent Application No. 63/092,789, filed on Oct. 16, 2020, and entitled "Device Including a Hydrophilic, Non-Ionic Coating for Size Exclusion Chromatography", the content of which is incorporated herein by reference in its entirety.

TECHNICAL FIELD

The present disclosure relates to a coating process for chromatographic applications that require or benefit from a hydrophilic and/or non-ionic surface. Particularly, the disclosure relates to a two-step vapor-liquid coating process for wettable surfaces within chromatography columns and systems, such as components having metallic surfaces. In addition, the present disclosure relates to an improved size exclusion chromatographic device and method.

BACKGROUND

Analytes that interact with metal have often proven to be very challenging to separate. Some of these challenges originate from interactions of the analytes with the materials that are used to construct the flow path through which the analytes travel. The desire to have high pressure capable chromatographic systems with minimal dispersion has required that flow paths decrease in diameter and be able to withstand increasingly high pressures at increasingly fast flow rates. As a result, the material of choice for chromatographic flow paths is often metallic in nature. This is despite the fact that certain characteristics of biomolecules are known to have unfavorable interactions, so called chromatographic secondary interactions, with metallic surfaces.

Pure metals and metal alloys (along with their corresponding oxide layers) have terminal metal atoms that have characteristics of a Lewis acid. More simply, these metal atoms show a propensity to accept donor electrons. This propensity is even more pronounced with any surface metal ions bearing a positive charge. Analytes with sufficient Lewis base characteristics (any substance that can donate non-bonding electrons) can potentially adsorb to these sites and thus form problematic non-covalent complexes. Analytes having sufficient Lewis base characteristic to interact in this manner are defined as metal-interacting analytes.

For instance, the phosphate groups of certain biomolecules are excellent polydentate ligands capable of high affinity metal chelation. This interaction causes phosphorylated species to bind to the flow path metals thus reducing the detected amounts of such species, a particularly troublesome effect given that phosphorylated species are frequently the most important analytes of an assay.

Carboxylate groups, often present in biomolecule analytes, also have the ability to chelate to metals, albeit with lower affinities than phosphate groups. Yet, the presence in certain biomolecule analytes of large numbers of carboxylate groups gives the opportunity for cumulative polydentate-based adsorptive losses. These complications can exist not only with peptides and proteins, but also glycans. For example, N-glycan species can at times contain one or more phosphate groups as well as one or more carboxylate-containing sialic acid residues. Additionally, smaller biomolecules such as nucleotides and saccharides, like sugar phosphates, can exhibit similar behavior to the previously mentioned N-glycan molecules. Moreover, chromatographic secondary interactions can be especially problematic with biomolecules, particularly larger structures, because they have a capacity (via their size and structural order) to form microenvironments that can adversely interact with separation components and flow path surfaces. In this case, a biomolecule can present structural regions with chemical properties that amplify a secondary interaction to the material of a flow path. This amplified secondary interaction, combined with the cumulative metal chelation effects, curtails the overall effective separation of biomolecules.

An alternative to using metal flow paths is to use flow paths constructed from polymeric materials, such as polyether ether ketone (PEEK). PEEK tubing, like most polymeric materials, is formed by means of an extrusion process. With polymeric resin, this manufacturing process can lead to highly variable internal diameters. Accordingly, PEEK column hardware yields unfavorable differences in the retention times as can be observed from switching between one column and the next. Often, this variation can be a factor of three higher than a metal constructed column. In addition, the techniques for fabricating polymer based frits are not yet sufficiently optimized to afford suitably rugged components for commercial HPLC columns. For example, commercially available PEEK frits tend to exhibit unacceptably low permeability Accordingly, it would be desirable in the art to provide methods and materials which reduce chelation and secondary interactions of biomolecule analytes with metallic surfaces to which they are exposed during chromatographic separations.

SUMMARY

The present is generally directed to a device and method for improved size exclusion chromatography (SEC) or anion exchange separations. In particular, the device and method utilize a column that provide improved performance and reduced secondary interactions. In general, the devices and methods feature a metallic flow path wherein at least a portion of its wetted surfaces includes a hydrophilic, non-ionic coating layer comprising a polyethylene glycol silane. In some embodiments, the devices and methods feature a stationary phase that comprises porous particles having a surface, wherein at least some portion is modified with a hydroxyl-terminated polyethylene glycol. In some embodiments, the devices and methods feature a stationary phase that comprises an anion exchange resin. Methods of the present technology feature performing an SEC or an anion exchange separation of an analyte using the device to provide improved separation results.

The present disclosure is also directed to a method for modifying a fluidic flow path disposed within an interior of a fluidic system. The method generally comprises contacting the fluidic flow path with an organosilane in the vapor phase to form a primer coating, followed by contacting the fluidic flow path with a liquid phase organosilane to provide a hydrophilic and/or non-ionic surface.

It has now been found according to the present disclosure that coating the metallic flow paths of instrumentation and chromatographic devices with certain hydrophobic and hydrophilic organosilane reagents in a two-step, vapor/solution phase process provides a uniform primer layer from the vapor phase coating, allowing the subsequent solution-based coating to more uniformly and completely coat the flow paths. The disclosed methods can be applied to stainless steel or other metallic flow path components and provides a manufacturing advantage over alternative non-metallic or non-metallic lined components. That is, one or more of the methods herein are advantageous as they allow high pressure components to be manufactured out of stainless steel or other metallic or high pressure material. These components made of high pressure material can then be tailored in that the internal flow paths can be modified with a coating to address the hydrophobicity of the flow path.

Accordingly, in one aspect, the present technology is directed to a method of creating a hydrophilic, non-ionic surface in a chromatographic system. The method comprises: depositing a primer layer on an interior surface of a chromatographic component using vapor deposition; and forming the hydrophilic, non-ionic surface by depositing a solution-based polyethylene glycol (PEG) silane on the primer layer.

In another aspect, the present technology is directed to a chromatographic device for separating analytes in a sample. The device comprises a sample injector having a sample injection needle configured for injecting a sample into a mobile phase, a sample reservoir in fluid communication with the sample injector, a chromatography column downstream of and in fluid communication with the sample injector, the chromatography column having fluid connectors and fluid conduits connecting the sample injector and the chromatography column, each of said fluid conduits, sample injector, sample reservoir, and chromatography column having interior surfaces, said interior surfaces forming a fluidic flow path having wetted surfaces, at least a portion of the wetted surfaces having a hydrophilic, non-ionic surface as described herein. In some embodiments, the stationary phase comprises porous particles having a surface, wherein at least some portion thereof is modified with a hydroxy-terminated polyethylene glycol. In some embodiments, the stationary phase comprises a porous anion exchange resin.

In a further aspect, the present technology is directed to an improved size exclusion chromatography (SEC) process which includes using metallic flow path components having a hydrophilic, non-ionic surface as described herein in combination with stationary phase materials based on hydroxy-terminated PEG surface modified silica or hydroxy-terminated PEG surface modified inorganic-organic hybrid particles. Use of metallic flow path components having a hydrophilic, non-ionic surface in combination with hydroxy-terminated PEG surface modified stationary phase materials for SEC is particularly advantageous in reducing secondary interactions of the analyte with the system as a whole. Specifically, the combination of both the coated hardware and the hydroxy-terminated PEG surface modified stationary phase materials provides advantages over conventional SEC columns. These advantages include the ability to perform SEC separations with weakly buffered mobile phase, simplified method development including reduced dependence on buffers, pHs, and column temperatures, enhanced analyte recovery, improved analyte peak shape, enhanced peak resolution, enhanced reproducibility.

In a still further aspect, the present technology is directed to an improved anion exchange separation process which includes using metallic flow path components having a hydrophilic, non-ionic surface as described herein in combination with stationary phase materials based on anion exchange materials, for example, a quaternary ammonium ion exchange resin. Use of metallic flow path components having a hydrophilic, non-ionic surface in anion exchange separations is particularly advantageous in reducing secondary interactions of the analyte with the system as a whole. Specifically, the use of metallic flow path components having a hydrophilic, non-ionic surface provides advantages over conventional anion exchange columns. These advantages include enhanced analyte recovery, enhanced reproducibility, and a reduction in sample-based passivation.

BRIEF DESCRIPTION OF THE DRAWINGS

In order to provide an understanding of embodiments of the technology, reference is made to the appended drawings, which are not necessarily drawn to scale. The drawings are exemplary only, and should not be construed as limiting the technology. The disclosure described herein is illustrated by way of example and not by way of limitation in the accompanying figures.

FIGS. 6A-6T depict exemplary chromatographic separations of a BEH200 protein standard performed with different mobile phases (pH 6.0 to 8.0 and NaCl concentrations from 0 to 200 mM) on a prototype hydroxy-terminated PEG surface-modified, inorganic-organic hybrid particle SEC column in a system and using a reference stainless steel frit.

FIGS. 7A-7T depict exemplary chromatographic separations of a BEH200 protein standard performed with different mobile phases (pH 6.0 to 8.0 and NaCl concentrations from 0 to 200 mM) on a prototype hydroxy-terminated PEG surface-modified, inorganic-organic hybrid particle SEC column in a system using a coated frit according to an embodiment of the disclosure.

FIGS. 9A-9T depict exemplary chromatographic separations of Trastutuntab emtansine (Kadcyla; Genentech) performed with different mobile phases (pH 6.0 to 8.0 and NaCl concentrations from 0 to 200 mM) on a prototype hydroxy-terminated PEG surface-modified, inorganic-organic hybrid particle SEC column in a system using a coated frit according to an embodiment of the disclosure.

FIG. 10 is a chart depicting exemplary % recovery versus number of injections of an intact mAb (mouse IgG1) for reference materials and a material prepared according to an embodiment of the disclosure.

DETAILED DESCRIPTION

Figure 1:
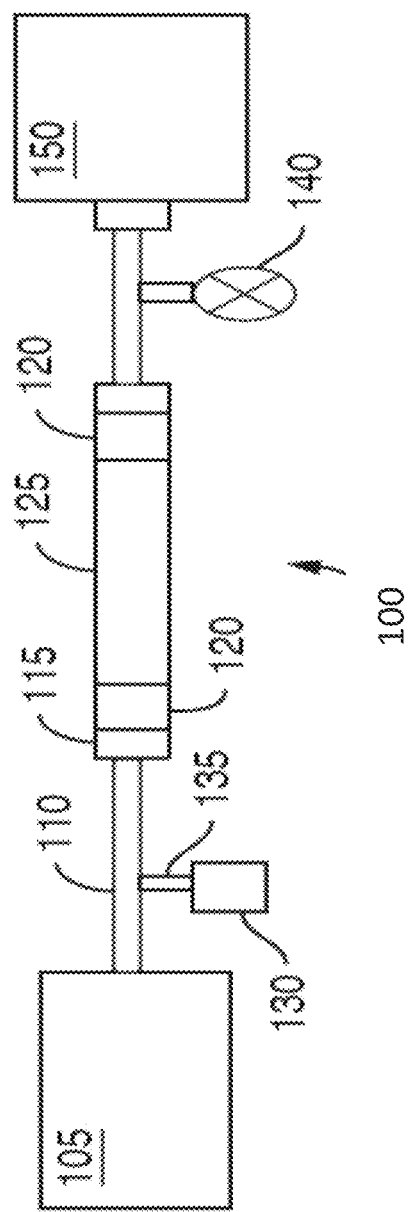
FIG. 1 is a schematic of a chromatographic flow system including a chromatography column and various other components, in accordance with an illustrative embodiment of the technology. A fluid is carried through the chromatographic flow system with a fluidic flow path extending from a fluid manager to a detector.

Before describing several example embodiments of the technology, it is to be understood that the technology is not limited to the details of construction or process steps set forth in the following description. The technology is capable of other embodiments and of being practiced or being carried out in various ways.

In general, the technology is directed to a method for modifying a fluidic flow path disposed within an interior of a fluidic system. The method generally comprises contacting the fluidic flow path with an organosilane in the vapor phase, followed by contacting the fluidic flow path with a liquid phase organosilane. Generally, a vapor phase deposition of an organosilane reagent is performed, forming an organosilane primer coating on at least a portion of the wetted surfaces of fluidic systems (e.g., liquid chromatography systems), and a liquid phase deposition of a different organosilane reagent is subsequently performed, forming an organosilica coating on at least a portion of the wetted surfaces of fluidic systems, and in direct contact with the organosilane primer coating. Such coatings modify the fluidic path and decrease secondary interactions, such as ionic and/or hydrophobic interactions, which may otherwise occur during chromatographic separations (e.g., size exclusion, ion exchange, or other types of chromatography) of certain analytes, such as biomolecule analytes. As such, the modified surfaces are bioinert or low-bind (meaning that analytes of a sample do not interact, or have minimal interaction, with the coatings). In addition, the deposited coatings are highly tunable to provide a range of desirable contact angles (e.g., make the wetted surfaces hydrophilic or hydrophobic), chemistries, and properties to achieve a desired effect on the flow path and ultimately the analyte passing through the flow path.

Surprisingly, it has been found according to the present disclosure that the vapor phase deposition of the organosilane reagent provides a uniform coating thickness within high aspect ratio parts, and provides a reactive primer layer for the subsequent liquid-phase deposition of the subsequent organosilane reagent. The liquid coating of this organosilane reagent (e.g., a polyethylene glycol (PEG) derivative) then results in a denser and more uniform coating than can be achieved without the primer layer. It has further been found according to the present disclosure that in size exclusion chromatography (SEC) separations of proteinaceous and hydrophobic analytes, the use of fluidic system parts coated according to the disclosed method (i.e., having a dense and more uniform coating hydrophilic coating), combined with a column containing hydroxy-terminated polyethylene glycol surface modified stationary phase particles, made significant improvements in the SEC chromatography. These improvements include a further reduction in hydrophobic interactions. Specifically, the combination of both the coated hardware and the hydroxy-terminated PEG surface modified stationary phase materials provides advantages of conventional SEC columns. These advantages include the ability to perform SEC separations with weakly buffered mobile phase, simplified method development including reduced dependence on buffers, pHs, and column temperatures, enhanced analyte recovery, improved analyte peak shape, enhanced peak resolution, and enhanced reproducibility.

It has further been found according to the present disclosure that in anion exchange separations of nucleic acid analytes (e.g., mRNA) the use of fluidic system parts coated according to the disclosed method (i.e., having a dense and more uniform coating hydrophilic coating), made significant improvements in the anion exchange separations relative to separations performed on uncoated fluidic system parts. These improvements include enhanced analyte recovery, enhanced reproducibility, and a reduction in sample-based passivation.

While the two step deposition method as disclosed herein has been described with reference to the solution phase deposition of non-ionic, hydrophilic organosilanes (e.g., polyethyleneglycols), and the use of the resulting non-ionic, hydrophilic surfaces have been described herein with respect to SEC, one of skill in the art will recognize that other functionalities may be used in place of the non-ionic, hydrophilic organosilanes. For example, the non-ionic, hydrophilic liquid phase organosilane may be replaced with, for example, liquid phase organosilanes having ionic functionality. Such functionalities include, but are not limited to, sulfonic acids, carboxylic acids, amines, quaternary ammonium groups, phosphate, and the like, as well as combinations thereof. Wetted surfaces modified in this manner may find utility in, for example, anti-bacterial applications, metal chelation, and ion chromatography.

Definitions

With respect to the terms used in this disclosure, the following definitions are provided. This application will use the following terms as defined below unless the context of the text in which the term appears requires a different meaning The articles "a" and "an" are used herein to refer to one or to more than one (i.e., to at least one) of the grammatical object of the article. The term "about" used throughout this specification is used to describe and account for small fluctuations. For example, the term "about" can refer to less than or equal to ±5%, such as less than or equal to ±2%, less than or equal to ±1%, less than or equal to ±0.5%, less than or equal to ±0.2%, less than or equal to ±0.1% or less than or equal to ±0.05%. All numeric values herein are modified by the term "about," whether or not explicitly indicated. A value modified by the term "about" of course includes the specific value. For instance, "about 5.0" must include 5.0.

Chromatography is a separation method for concentrating or isolating one or more compounds (e.g., biomolecules) found in a mixture. The compounds (e.g., biomolecules) are normally present in a sample. This disclosure uses the term "sample" broadly to represent any mixture which an individual may desire to analyze. The term "mixture" is used in the sense of a fluid containing one or more dissolved compounds (e.g., biomolecules). A compound of interest present in said sample is referred to as an analyte.

Chromatography is a differential migration process. Compounds in a mixture traverse a chromatographic column at different rates, leading to their separation. The migration occurs by convection of a fluid phase, referred to as the mobile phase, in relationship to a packed bed of particles or a porous monolith structure, referred to as the stationary phase. In some modes of chromatography, differential migration occurs by differences in affinity of analytes with the stationary phase and mobile phase.

Size exclusion chromatography (SEC) is a type of chromatography in which the analytes in a mixture are separated or isolated on the basis of hydrodynamic radius. In SEC, separation occurs because of the differences in the ability of analytes to probe the volume of the porous stationary phase media. See, for example, A. M. Striegel et. al. Modern Size-Exclusion Chromatography: Practice of Gel Permeation and Gel Filtration Chromatography, 2nd Edition, Wiley, NJ, 2009. SEC is typically used for the separation of large molecules or complexes of molecules. For example, without limitation, many large molecules of biological origin ("biomolecules"), such as deoxyribonucleic acids (DNAs), ribonucleic acids (RNAs), proteins, antibodies, polysaccharides, antibody-drug conjugates, and fragments and complexes of any thereof are analyzed by SEC. Synthetic polymers, plastics, and the like are also analyzed by SEC.

SEC is normally performed using a column having a packed bed of particles. The packed bed of particles is a separation media or stationary phase through which the mobile phase will flow. The column is placed in fluid communication with a pump and a sample injector. The sample is loaded onto the column under pressure by the sample injector and the sample components and mobile phase are pushed through the column by the pump. The components in the sample leave or elute from the column with the largest molecules (largest hydrodynamic radius) exiting first and the smallest molecules leaving last.

Anion exchange chromatography is performed as described for SEC, except that the stationary phase is an anion exchange resin. In anion exchange chromatography, analytes in a mixture are separated or isolated on the basis of net surface charge. Anion exchange chromatography uses a positively charged ion exchange resin with an affinity for molecules having net negative surface charges. As with SEC, anion exchange chromatography may be used for the separation of large molecules or complexes of molecules. For example, without limitation, biomolecules such as deoxyribonucleic acids (DNAs), ribonucleic acids (RNAs), amino acids, or proteins may be separated.

In both SEC and anion exchange separations, the respective column is placed in fluid communication with a detector, which can detect the change in the nature of the mobile phase as the mobile phase exits the column. The detector will register and record these changes as a plot, referred to as a chromatogram, which is used to determine the presence or absence of the analyte, and, in some embodiments, the concentration thereof. The time at which the analyte leaves the column (retention time) is an indication of the size of the molecule. Molecular weight of the molecules can be estimated using standard calibration curves. Examples of detectors used for SEC and anion exchange chromatography are, without limitation, refractive index detectors, UV detectors, light-scattering detectors, and mass spectrometers.

The terms "polyethylene glycol" and "polyethylene oxide" are used synonymously herein, both terms referring to oligomeric or polymeric polyether compounds having the formula —$(O-CH_2CH_2)_n$—OH. Accordingly, the abbreviations for "polyethylene glycol" and "polyethylene oxide", "PEG" and "PEO", respectively, are used synonymously herein.

The term "methoxy-terminated polyethylene glycol", abbreviated herein as "MeO-PEO" or "MeO-PEG", refers to oligomeric or polymeric polyether compounds having the formula —$(O-CH_2CH_2)_n$—OMe. In contrast to hydroxy-terminated polyethylene glycols (HO-PEGs), MeO-PEGs do not have a free hydroxyl (OH) group available, having been capped with a methyl group.

The term "modifying a fluidic flow path" as used herein, refers to the process of modifying the surface of a material by changing physical and/or chemical characteristics of the surface (e.g., a wettable surface) to improve the properties thereof. The term "modified fluidic flow path" as used herein, refers to a material (e.g., a metallic component of a chromatography system) which has been allowed to react with at least two different organosilane reagents to covalently bond the organosilane reagents to the surface of the material, to each other, or both. In certain embodiments, the organosilane reagents are attached to the surface of the material by a siloxane bond. For example, the surface of a metallic material contains metal oxides and/or free hydroxyl groups, which can be reacted with one or more reactive organosilane reagents (e.g., halo or alkoxy substituted silanes), thus producing at least M—O—Si—C linkages.

The term "organosilica" as used herein, refers to any of a range of hybrid materials combining silica with various organic compounds.

The term "organosilane" as used herein refers to monomeric silicone-based chemicals, similar to hydrocarbons, which have at least one direct bond between a silicon atom and a carbon atom in the molecule.

Embodiments of the present disclosure are now described in detail with the understanding that such embodiments are exemplary only. Such embodiments constitute what the inventors now believe to be the best mode of practicing the technology. Those skilled in the art will recognize that such embodiments are capable of modification and alteration.

Devices

FIG. 1 is a representative schematic of a chromatographic flow system/device 100 that can be used to separate analytes in a sample. Chromatographic flow system 100 includes several components including a fluid manager system 105 (e.g., controls mobile phase flow through the system), tubing 110 (which could also be replaced or used together with microfabricated fluid conduits), fluid connectors 115 (e.g., fluidic caps), frits 120, a chromatography column 125, a sample injector 135 including a needle (not shown) to insert or inject the sample into the mobile phase, a vial, sinker, or sample reservoir 130 for holding the sample prior to injection, a detector 150 and a pressure regulator 140 for controlling pressure of the flow. Interior surfaces of the components of the chromatographic system/device form a fluidic flow path that has wetted surfaces. The fluidic flow path can have a length to diameter ratio of at least 20, at least 25, at least 30, at least 35 or at least 40.

The detector 150, can be a mass spectrometer. The fluidic flow path can include wetted surfaces of an electrospray needle (not shown).

At least a portion of the wetted surfaces can be coated with an organosilica coating, described in detail herein below, to tailor its hydrophobicity and reduce or eliminate ionic interactions with e.g., certain analytes. The coating is applied by a combination of vapor and liquid phase organosilane depositions. As such, methods and devices of the present technology provide the advantage of being able to use high pressure resistant materials (e.g., stainless steel) for the creation of the flow system, but also being able to tailor the wetted surfaces of the fluidic flow path to provide the appropriate hydrophobicity so deleterious interactions or undesirable chemical effects on the analyte can be minimized.

The organosilica coating can be provided throughout the system from the tubing or fluid conduits 110 extending from the fluid manager system 105 all the way through to the detector 150. The coatings can also be applied to portions of the fluidic fluid path. That is, one may choose to coat one or more components or portions of a component and not the entire fluidic path. For example, the internal portions of the column 125 and its frits 120 and end caps 115 can be coated whereas the remainder of the flow path can be left unmodified. Further, removable/replaceable components can be coated. For example, the vial or sinker 130 containing the sample reservoir can be coated as well as frits 120.

In one aspect, the flow path of the fluidic systems described herein is defined at least in part by an interior surface of tubing. In another aspect, the flow path of the fluidic systems described herein is defined at least in part by an interior surface of microfabricated fluid conduits. In another aspect, the flow path of the fluidic systems described herein is defined at least in part by an interior surface of a column. In another aspect, the flow path of the fluidic systems described herein is defined at least in part by passageways through a frit. In another aspect, the flow path of the fluidic systems described herein is defined at least in part by an interior surface of a sample injection needle. In another aspect, the flow path of the fluidic systems described herein extends from the interior surface of a sample injection needle throughout the interior surface of a column. In another aspect, the flow path extends from a sample reservoir container (e.g. sinker) disposed upstream of and in fluidic communication with the interior surface of a sample injection needle throughout the fluidic system to a connector/port to a detector.

In some embodiments, only the wetted surfaces of the chromatographic column and the components located upstream of the chromatographic column are coated with an organosilica coating described herein, while wetted surfaces located downstream of the column are not coated.

At least a portion of the wetted surfaces of the fluidic flow path are coated with an organosilica coating as described herein. The organosilica coating is inert to at least one of the analytes in a sample, such as a biomolecule including, but not limited to, deoxyribonucleic acids (DNAs), ribonucleic acids (RNAs), proteins, polysaccharides, antibodies, antibody-drug conjugates, glycans, sugar phosphates, and the like.

In some embodiments, the first (i.e., primer) coating comprises a structure according to Formula I

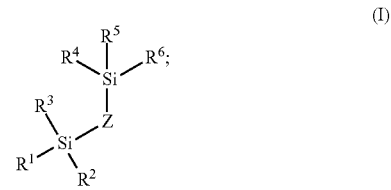

wherein:
$R^1$, $R^2$, $R^3$, $R^4$, $R^5$, and $R^6$ are each independently OH or $OR^A$;
$R^A$ represents a point of attachment to the wetted surface of the fluidic flow path, wherein at least one of $R^1$, $R^2$, $R^3$, $R^4$, $R^5$, and $R^6$ is $OR^A$; and
Z is $(C_1\text{-}C_{20})$alkyl, $-[O(CH_2)_2O]_{1\text{-}20}$, $-[(C_1\text{-}C_{10})NH(CO)NH(C_1\text{-}C_{10})]_{1\text{-}20}-$, or $-[(C_1\text{-}C_{10})\text{alkylphenyl}(C_1\text{-}C_{10})\text{alkyl}]_{1\text{-}20}$.

In some embodiments, Z is $-(C_2\text{-}C_{10})$alkyl.
In some embodiments, Z is $-(CH_2CH_2)-$.

Figure 2:
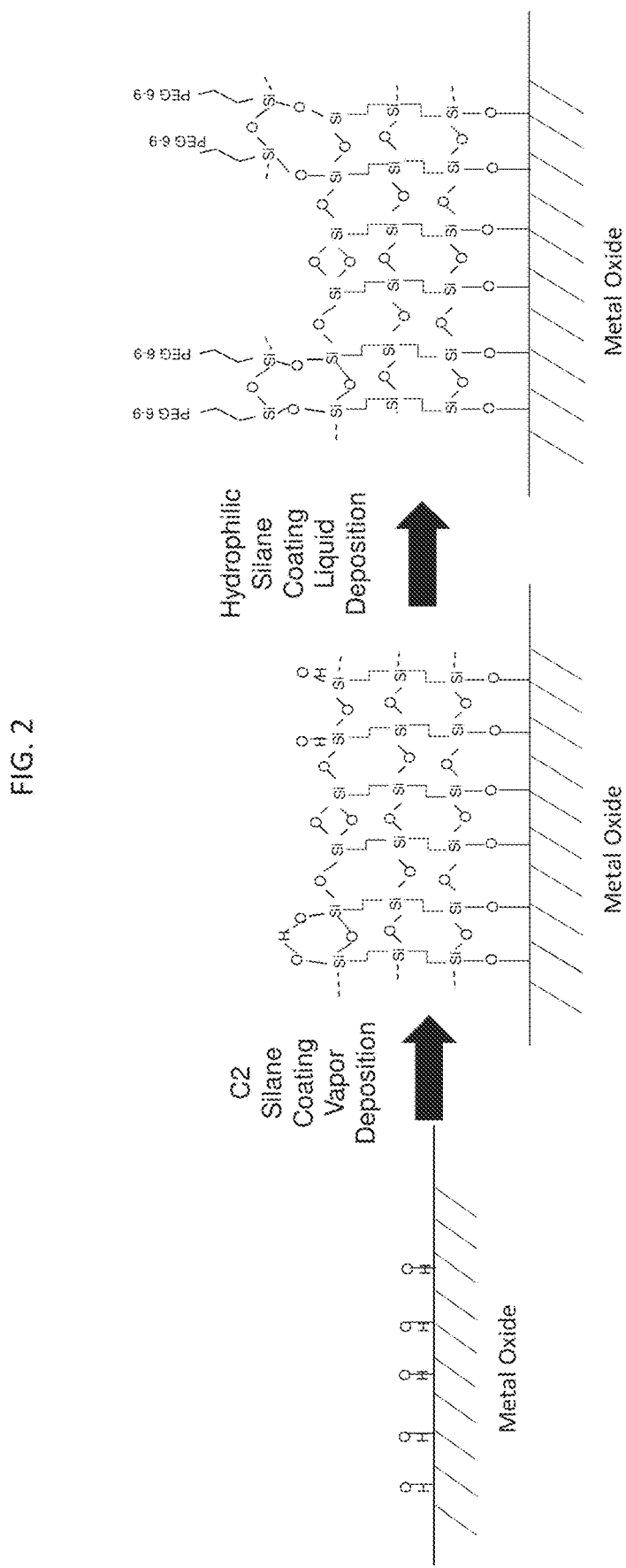
FIG. 2 depicts a non-limiting cartoon illustration of the modified surfaces according to an embodiment of the disclosed method

A non-limiting, simplified, illustrative embodiment is provided in FIG. 2. Referring to FIG. 2, a C2 (ethylene) bridged siloxane coating according to an embodiment of the disclosure is shown bound to surface hydroxyl groups of a metallic chromatography component.

Figure 15:
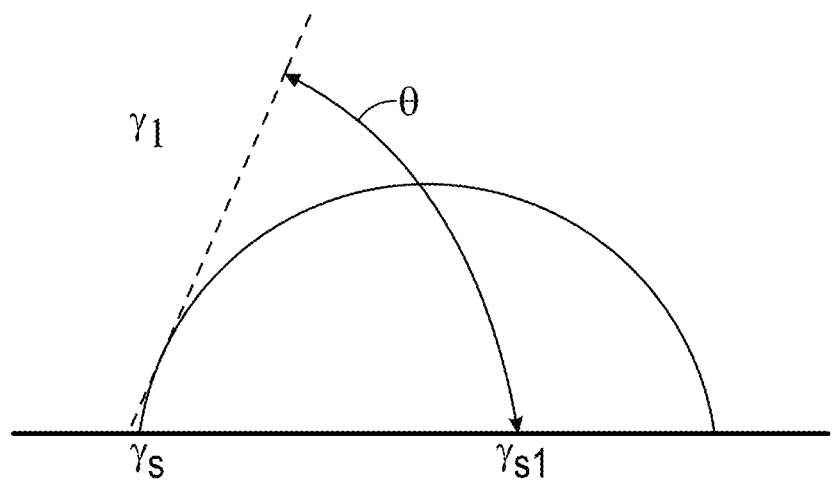
FIG. 15 is an illustration defining a contact angle of a droplet of liquid on a surface.

The contact angle of water on the organosilica coating of Formula I may vary. A contact angle (also referred to as a wetting angle) is formed when a drop of liquid (e.g., water) is placed on a material surface (e.g., an organosilica coating as disclosed herein) and the drop forms a dome shape on the surface. The angle formed between the surface and a line tangent to the edge of the drop of liquid is referred to as the contact angle Θ represented in FIG. 15. Contact angles may be determined with, for example, a contact angle goniometer.

As a drop spreads across a surface (e.g., a hydrophilic surface) and the dome becomes flatter, the contact angle becomes smaller. In contrast, when a drop of liquid beads on the surface (e.g. a hydrophobic surface), the dome becomes taller and the angle becomes larger.

In some embodiments, the organosilica coating of Formula I has a contact angle with water of at least about 15°. In some embodiments, the organosilica coating of Formula I can have a contact angle with water of less than or equal to 30°. In some embodiments, the organosilica coating of Formula I can have a contact angle with water less than or equal to about 90°. In some embodiments, the contact angle of the organosilica coating of Formula I with water is between about 15° to about 105°. For example, the contact angle of the organosilica coating of Formula I with water can be about 0°, 5°, 10°, 15°, 20°, 25°, 30°, 35°, 40°, 45°, 50°, 55°, 60°, 65°, 70°, 75°, 80°, 85°, 90°, 95°, 100°, or 105°.

The thickness of the organosilica coating of Formula I can be at least about 100 Å. For example, the thickness can be between about 100 Å to about 1600 Å. The thickness of the organosilica coating of Formula I can be about 100 Å, 200 Å, 300 Å, 400 Å, 500 Å, 600 Å, 700 Å, 800 Å, 900 Å, 1000 Å, 1100 Å, 1200 Å, 1300 Å, 1400 Å, 1500 Å or 1600 Å. The thickness of the organosilica coating of Formula I (e.g., a vapor deposited organosilica coating) can be detected optically by the naked eye. For example, more opaqueness and coloration is indicative of a thicker coating. Thus, coatings with pronounced visual distinction are an embodiment of this technology. From thin to thick, the color changes from yellow, to violet, to blue, to slightly greenish and then back to yellow when coated parts are observed under full-spectrum light, such as sunlight. For example, when the organosilica coating of Formula I is 300 Å thick, the coating can appear yellow and reflect light with a peak wavelength between 560 and 590 nm. When the organosilica coating of Formula I is 600 Å thick, the coating can appear violet and reflect light with a peak wavelength between 400 and 450 nm. When the organosilica coating of Formula I is 1000 Å thick, the coating can appear blue and reflect light with a peak wavelength between 450 and 490 nm. See, e.g., Faucheu et al., Relating Gloss Loss to Topographical Features of a PVDF Coating, Published Oct. 6, 2004; Bohlin, Erik, Surface and Porous Structure of Pigment Coatings, Interactions with flexographic ink and effects of print quality, Dissertation, Karlstad University Studies, 2013:49.

The second organosilica coating is on at least a portion of the wetted surface of the fluidic flow path, and is in direct contact with the first coating. In some embodiments, the second coating comprises a structure according to Formula II

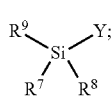

wherein:

$R^7$, $R^8$, and $R^9$ are each independently OH or $OR^B$;

$R^B$ represents a point of attachment to the wetted surface of the fluidic flow path, or represents a point of attachment to the first coating, wherein in either instance, at least one of $R^7$, $R^8$, and $R^9$ is $OR^B$;

Y is —$(C_1$-$C_6)$alkyl —$OR^{12}$, —$[O(C_1$-$C_3)$alkyl$]_{1-10}$O$(C_1$-$C_6)$alkyl, —$[O(C_1$-$C_3)$alkyl$]_{1-10}$OH, or phenyl, wherein said $(C_1$-$C_6)$alkyl is substituted with one or more halo or one or more functional groups selected from the group consisting of OH, amino, $(C_1$-$C_6)$alkylamino, di$(C_1$-$C_6)$alkylamino, cyano, —C(O)NH$_2$, sulfonic acid, quaternary ammonium, phosphate, and carboxyl, and wherein said phenyl is optionally substituted with one or more groups selected from the group consisting of $(C_1$-$C_3)$alkyl, OH, halo, cyano, —C(O)NH$_2$, and carboxyl; and $R^{12}$ is —$(C_1$-$C_3)$alkanediol, —$(C_1$-$C_3)$alkyl-3,4-cyclohexanediol, or —$(C_2$-$C_4)$alkylOH;

In some embodiments, $R^B$ represents a point of attachment to the wetted surface of the fluidic flow path.

In some embodiments, $R^B$ represents a point of attachment to the first coating. In such embodiments, one of skill in the art will recognize that the attachment is to a hydroxyl group associated with the coating of Formula I, such as one or more of $R^1$, $R^2$, $R_3$, $R^4$, $R^5$, and $R^6$ when said one or more of $R_1$, $R_2$, $R_3$, $R_4$, and $R^6$ represents one or more hydroxyl groups.

A non-limiting, simplified, illustrative embodiment is provided in FIG. 2. Referring to FIG. 2, an alkylsilyl polyethyleneglycol coating is bound to free hydroxyl groups of a C2 (ethylene) bridged siloxane coating according to an embodiment of the disclosure.

In some embodiments, Y is —$[O(C_1$-$C_3)$alkyl$]_{1-10}$O$(C_1$-$C_6)$alkyl or —$[O(C_1$-$C_3)$alkyl$]_{1-10}$OH. In some embodiments, Y is —$[O(C_1$-$C_3)$alkyl$]_{1-10}$O$(C_1$-$C_6)$alkyl. In some embodiments, Y is —$[O(C_1$-$C_3)$alkyl$]_{1-10}$OH.

In some embodiments, the second coating comprising the structure according to Formula II comprises the structure:

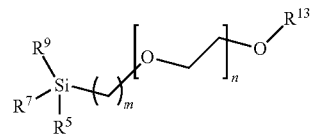

wherein:

$R^7$, $R^8$, and $R^9$ are each are each as defined above;

$R^B$ is as defined above;

$R^{13}$ is H or $CH_3$;

m is an integer from about 1 to about 10; and n is an integer from about 2 to about 50.

In some embodiments, m is 3 and n is from about 8 to about 12. In some embodiments, m is 3 and n is from about 6 to about 9. In some embodiments, m is 3, n is from about 8 to about 12, and $R^{13}$ is H. In some embodiments, m is 3, n is from about 6 to about 9, and $R^{13}$ is $CH_3$.

The contact angle of water on the organosilica coating of Formula II may vary. In some embodiments, the organosilica coating of Formula II can have a contact angle with water of at least about 15°. In some embodiments, the organosilica coatings of Formula II can have a contact angle with water of less than or equal to 105°. The contact angle with water can be less than or equal to about 90°. In some embodiments, the contact angle with water is between about 15° to about 105°. For example, the contact angle with water can be about 0°, 5°, 10°, 15°, 20°, 25°, 30°, 35°, 40°, 45°, 50°, 55°, 60°, 65°, 70°, 75°, 80°, 85°, 90°, 95°, 100°, or 105°.

The combined thickness of the multi-layered organosilica coatings of Formulae I and II can be at least about 100 Å. For example, the thickness can be between about 100 Å to about 1600 Å. The combined thickness of the multi-layered organosilica coatings of Formulae I and II can be about 100 Å, 200 Å, 300 Å, 400 Å, 500 Å, 600 Å, 700 Å, 800 Å, 900 Å, 1000 Å, 1100 Å, 1200 Å, 1300 Å, 1400 Å, 1500 Å or 1600 Å.

Method of Creating A Hydrophilic, Non-Ionic Surface

Figure 3:
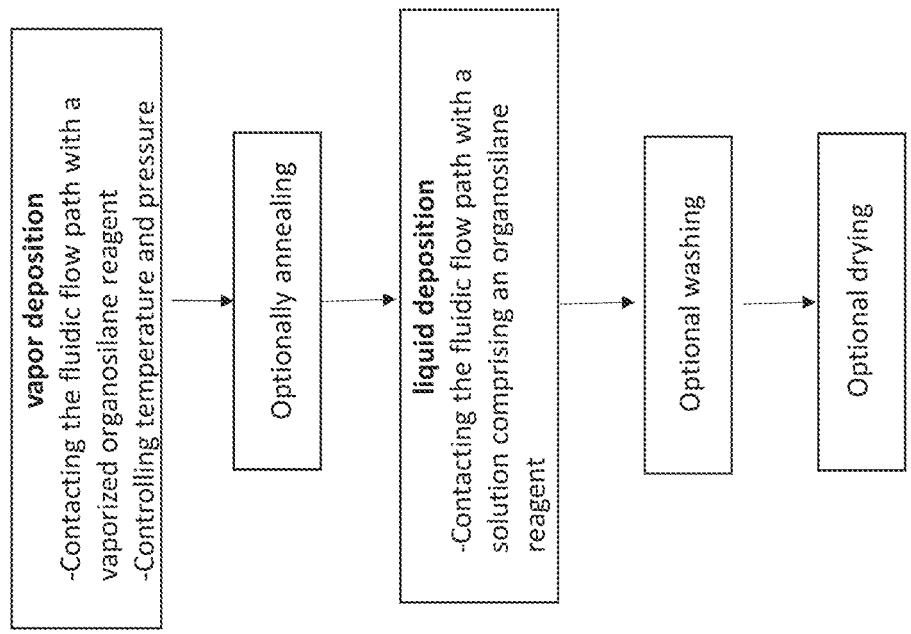
FIG. 3 is a flow chart illustrating an embodiment of the disclosed method.

In a first aspect is provided a method of creating a hydrophilic, non-ionic surface in a chromatographic system, the method comprising:

a. depositing a primer layer on an interior surface of a chromatographic component using vapor deposition; and b. forming the hydrophilic, non-ionic surface by depositing a solution based PEG silane on the primer layer. FIG. 3 provides an illustration of this method.

In another aspect is provided a method of modifying a fluidic flow path disposed within an interior of a fluidic system, the fluidic flow path having a wetted surface comprising hydroxyl groups, the method comprising:

a. contacting the fluidic flow path with a vaporized organosilane reagent of Formula I

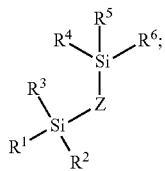

(I)

wherein:

$R^1$, $R^2$, $R^3$, $R^4$, $R^5$, and $R^6$ are each independently selected from the group consisting of ($C_1$-$C_6$)alkoxy, —NH($C_1$-$C_6$)alkyl, —N(($C_1$-$C_6$)alkyl)$_2$, OH, and halo; and Z is ($C_1$-$C_{20}$)alkyl, —[O(CH$_2$)]$_{1-20}$—, —[($C_1$-$C_{10}$)NH(CO)NH($C_1$-$C_{10}$)]$_{1-20}$—, or —[($C_1$-$C_{10}$)alkylphenyl($C_1$-$C_{10}$)alkyl]$_{1-20}$;

to form a first coating deposited on at least a portion of the wetted surface of the fluidic flow path; and b. contacting the fluidic flow path having the first coating deposited thereon with a solution comprising an organosilane reagent of Formula II

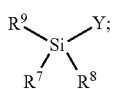

(II)

wherein:

$R^7$, $R^8$, and $R^9$ are each independently selected from the group consisting of $C_1$-$C_6$ alkyl, ($C_1$-$C_6$)alkenyl, —NHR$^{10}$, —NR$^{10}$R$^{11}$, OH, OR$^{10}$, and halo;

$R^{10}$ and $R^{11}$ are each independently selected from $C_1$-$C_6$ alkyl;

Y is —($C_1$-$C_6$)alkyl —OR$^{12}$, —[O($C_1$-$C_3$)alkyl]$_{1-10}$O($C_1$-$C_6$)alkyl, —[O($C_1$-$C_3$)alkyl]$_{1-10}$OH or phenyl, wherein said ($C_1$-$C_6$)alkyl is substituted with one or more halo or one or more functional groups selected from the group consisting of OH, amino, ($C_1$-$C_6$)alkylamino, di($C_1$-$C_6$)alkylamino, cyano, —C(O)NH$_2$, sulfonic acid, and carboxyl, and wherein said phenyl is optionally substituted with one or more groups selected from the group consisting of ($C_1$-$C_3$)alkyl, OH, halo, cyano, —C(O)NH$_2$, and carboxyl;

$R^{12}$ is —($C_1$-$C_3$)alkyloxirane, —($C_1$-$C_3$)alkyl-3,4-epoxycyclohexyl, or —($C_1$-$C_4$)alkylOH;

to form a second coating on at least a portion of the wetted surface of the fluidic flow path, and in direct contact with the first coating.

In some embodiments, Z is ($C_2$-$C_{10}$)alkyl. In some embodiments, Z is —(CH$_2$CH$_2$)—.

In some embodiments, $R^1$, $R^2$, $R^3$, $R^4$, $R^5$, and $R^6$ are each independently selected from the group consisting of ($C_1$-$C_2$)alkoxy, —N(($C_1$-$C_2$)alkyl)$_2$, and halo. In some embodiments, $R^1$, $R^2$, $R^3$, $R^4$, $R^5$, and $R^6$ are each methoxy or are each chloro.

In some embodiments, the reagent of Formula I is bis(trichlorosilyl)ethane or bis(trimethoxysilyl)ethane.

In some embodiments, $R^7$, $R^8$, and $R^9$ are each independently selected from the group consisting of —N[($C_1$-$C_6$)alkyl]$_2$, ($C_1$-$C_6$)alkoxy, and halo. In some embodiments, $R^7$, $R^8$, and $R^9$ are each ethoxy or are each dimethylamino.

In some embodiments, Y is —[O($C_1$-$C_3$)alkyl]$_{1-10}$O($C_1$-$C_6$)alkyl or —[O($C_1$-$C_3$)alkyl]$_{1-10}$OH. In some embodiments, Y is —[O($C_1$-$C_3$)alkyl]$_{1-10}$O($C_1$-$C_6$)alkyl. In some embodiments, wherein Y is —[O($C_1$-$C_3$)alkyl]$_{1-10}$OH.

In some embodiments, the organosilane reagent of Formula II has the structure

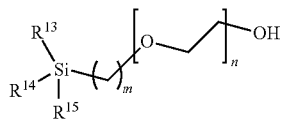

wherein m is an integer from about 1 to about 10;

n is an integer from about 2 to about 50; and $R^{13}$, $R^{14}$, and $R^{15}$ are each OEt.

In some embodiments, m is about 3, or is 3.

In some embodiments, n is an average value representing a mixture of different polyethylene glycol chain lengths. For example, in some embodiments, n may be 8 to 12, meaning the average distribution of chain lengths falls between 8 and 12 polyethylene glycol units. In other embodiments, n may be a specific value, such as from about 8, about 9, or about 10, to about 11, or about 12. In some embodiments, m is 3 and n is from about 8 to about 12.

In some embodiments, the organosilane reagent of Formula II has the structure

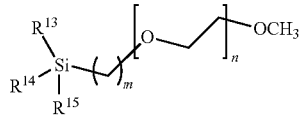

wherein m is an integer from about 1 to about 10;

n is an integer from about 2 to about 50; and $R^{13}$, $R^{14}$, and $R^{15}$ are each Cl, OCH$_3$, or dimethylamino.

In some embodiments, m is about 3, or is 3.

In some embodiments, n is an average value representing a mixture of different polyethylene glycol chain lengths. For example, in some embodiments, n may be 8 to 12, meaning the average distribution of chain lengths falls between 8 and 12 polyethylene glycol units. In some embodiments, n may be 6 to 9. In other embodiments, n may be a specific value, such as from about 6, about 7, about 8, about 9, or about 10, to about 11, or about 12. In some embodiments, m is 3 and n is from about 6 to about 9.

In some embodiments, the organosilane reagent of Formula II is 2-[methoxy(polyethyleneoxy)$_{6-9}$propyl]tris(dimethylamino) silane.

Generally, the solution comprises a solvent. Suitable solvents include volatile hydrocarbons, such as an aliphatic or aromatic organic solvent. In some embodiments, the solvent is toluene.

The solution may contain the organosilane reagent in a range of concentrations, such as in an amount by volume from about 0.01 to about 10%, or from about 0.05 to about 1%. In some embodiments, the concnetration by volume is from about 0.01, about 0.02, about 0.03, about 0.04, about 0.05, about 0.06, about 0.07, about 0.08, about 0.09, about 0.1, about 0.2, about 0.3, about 0.4, about 0.5, about 0.6, about 0.7, about 0.8, about 0.9, or about 1.0, to about 2, about 3, about 4, about 5, about 6, bout 7, about 8, about 9, or about 10%. In certain embodiments, the concentration of the organosilane reagent may be higher, such as 15, 20, 30, 40, 50, 60, 70, 80, 90, or even 99 or more % by volume.

The contacting with the organosilane reagent of Formula I or II may occur for a duration of time, for example, from about 1 second to about 3 days. In some embodiments, the contacting with the organosilane reagent of Formula I is for a period of time from about 1 second to about 30 minutes, or from about 5 seconds to about 15 minutes.

In some embodiments, the contacting with the organosilane reagent of Formula II is for a period of time from about 1 hour to about 96 hours, or from about 6 to about 48 hours, or from about 12 to about 24 hours.

The contacting with the organosilane reagent of Formula I or II may occur under a variety of different temperature conditions. In some embodiments, the contacting with the organosilane reagent of Formula I or II is at a temperature from about 0 to about 100° C., or from about 10 to about 25° C. In some embodiments, the contacting with the organosilane reagent of Formula II is at a temperature from about 15 to about 25° C.

In some embodiments, at least a portion of the first coating is hydrolyzed. This may generally be accomplished by exposing the first coating and/or the organosilane reagent of Formula I during said contacting, with water.

In some embodiments, at least a portion of the second coating is hydrolyzed. This may generally be accomplished by exposing the fluidic flow path with water following the contacting with the organosilane reagent of Formula II. In perfoming such hydrolyses, at least a portion of any remaining $R^1$, $R^2$, $R^3$, $R^4$, $R^5$, $R^6$, $R^7$, $R^8$, or $R^9$ groups are converted to OH groups, or are crosslinked with one another through siloxane bonds.

In some embodiments, any excess organosilane reagent is removed following the contacting of the fluidic flow path with the solution comprising the organosilane reagent. Generally, such removal may be accomplished by washing, rinsing, dipping, flushing, or otherwise exposing the fluidic flow path at least once to at least one solvent. In some embodiments, the solvent is toluene. In some embodiments, the solvent is an alcohol. In some embodiments, the alcohol is isopropanol. In some embodiments, the method comprises washing, rinsing, dipping, flushing, or otherwise exposing the fluidic flow path sequentially to two different solvents, such as toluene and isopropanol.

In some embodiments, the fluidic flow path is dried. Any suitable means may be used, such as exposure to vacuum, heat, or both. In some embodiments, the method further comprises drying the fluidic flow path following the contacting of the fluidic flow path with the solution comprising the organosilane reagent, the drying comprising exposing the fluidic flow path to an elevated temperature for a period of time.

In some embodiments, the first coating is annealed. Any suitable means may be used, such as exposure to heat for a period of time.

In some embodiments, stainless steel flow path components, including but not limited to tubing, microfabricated fluid conduits, column frits, column inlet tubing, and sample injection needles, are coated via the disclosed method. In one aspect, these coated components are annealed to alter their chemical or physical properties.

In some embodiments, flow path components that are made of other materials than stainless steel or other metallics, (e.g., polymers, glass, etc.) are coated via the disclosed method. In particular, frits for use within the system or sample vials connectable to the injection needle are coated.

Chromatographic Device

In another aspect, the present technology is directed to a chromatographic device for separating analytes in a sample. The device comprises a sample injector having a sample injection needle configured for injecting a sample into a mobile phase, a sample reservoir in fluid communication with the sample injector, a chromatography column downstream of and in fluid communication with the sample injector, the chromatography column having fluid connectors and fluid conduits connecting the sample injector and the chromatography column, each of said fluid conduits, sample injector, sample reservoir, and chromatography column having interior surfaces, said interior surfaces forming a fluidic flow path having wetted surfaces, at least a portion of the wetted surfaces having a hydrophilic, non-ionic surface as described herein.

Methods of Performing Size Exclusion Chromatography

Disclosed herein is an improved size exclusion chromatography (SEC) process. The process includes using metallic flow path components having a hydrophilic, non-ionic surface as described herein in combination with stationary phase materials based on hydroxy-terminated PEG surface modified silica or hydroxy-terminated PEG surface modified inorganic-organic hybrid particles. Use of metallic flow path components having a hydrophilic, non-ionic surface in combination with hydroxy-terminated PEG surface modified stationary phase materials for SEC is particularly advantageous in reducing secondary interactions of the analyte with the system as a whole. The process generally comprises contacting a sample containing at least one analyte with a column chromatography device as described herein, flowing a mobile phase through the stationary phase material for a period of time; and eluting the at least one analyte from the immobilized stationary phase in the mobile phase.

Stationary Phase Material

Size exclusion chromatography (SEC) is performed on a stationary phase material with a size-based affinity for the analyte. The metallic flow path components having a hydrophilic, non-ionic surface and the improved size exclusion chromatography (SEC) process utilizing the metallic flow path components as described herein are compatible with typical stationary phase materials suitable for SEC separations (e.g., methoxy-terminated polyethylene glycol and diol-bonded/coated bonded phases). As described herein above, the metallic flow path components having a hydrophilic, non-ionic surface of the disclosure are particularly advantageous when combined with a stationary phase material having reduced secondary (i.e., ionic and hydrophobic) interactions. One example of such a stationary phase material is that comprising porous particles having a surface, wherein at least some substantial portion thereof is modified with a hydroxy-terminated polyethylene glycol (PEG). The modified porous particles may be silica or inorganic-organic hybrid particles. A non-limiting example of such hydroxy-terminated PEG modified porous particles are those where the hydroxy-terminated polyethylene glycol has the formula

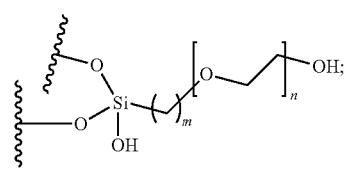

wherein:
m is an integer from about 1 to about 10;
n is an integer from about 2 to about 50; and
wherein the wavy lines indicate points of attachment to the surface of the porous particles.

Methods of Performing Anion Exchange Chromatography

Disclosed herein is an improved anion exchange chromatography process. The process includes using metallic flow path components having a hydrophilic, non-ionic surface as described herein in combination with stationary phase materials based on ion exchange resins. The process generally comprises contacting a sample containing at least one analyte with a column chromatography device as described herein, flowing a mobile phase through the stationary phase material for a period of time; and eluting the at least one analyte from the immobilized stationary phase in the mobile phase.

Stationary Phase Material

Anion exchange separation is performed on a stationary phase material which is a positively charged ion exchange resin with an affinity for molecules having net negative surface charges. The metallic flow path components having a hydrophilic, non-ionic surface and the improved anion exchange separation process utilizing the metallic flow path components as described herein are compatible with typical anion exchange resins suitable for anion exchange chromatography, such as quaternary ammonium ion exchange resins. As described herein above, the metallic flow path components having a hydrophilic, non-ionic surface of the disclosure are advantageous in enhancing analyte recovery and enhancing reproducibility relative to anion exchange separations performed on systems wherein the metallic flow path components are not surface modified.

Analyte

The improved process for performing SEC or anion exchange separations as disclosed herein comprises a sample containing at least one analyte. Notably, the utility of the presently disclosed process is not limited to biopharmaceuticals or proteinaceous analytes. In some embodiments, the at least one analyte comprises a small molecule drug, a natural product, or a polymer. In some embodiments, the at least one analyte comprises one or more biomolecules. In some embodiments, the biomolecule is a nucleic acid (e.g., RNA, DNA, oligonucleotide), protein (e.g., fusion protein), peptide, antibody (e.g., monoclonal antibody (mAb)), antibody-drug conjugate (ADC), polysaccharides, virus, virus-like particle, viral vector (e.g., gene therapy viral vector, adeno associated viral vector), biosimilar, or any combination thereof. In some embodiments, the at least one analyte comprises a nucleic acid, a polysaccharide, a peptide, a polypeptide, a protein, a growth factor, a carbohydrate, a fatty acid, a lipid, a glycan, an ion (e.g., a metal ion), or any combination thereof. In some embodiments, the at least one analyte comprises an antibody. In some embodiments, the at least one analyte comprises a monoclonal antibody (mAb). In some embodiments, the at least one analyte comprises a high molecular weight species or aggregate form of an antibody. In some embodiments the at least one analyte is an antibody-drug conjugate. In some embodiments, the at least one analyte comprises a nucleic acid, which is an RNA, such as mRNA. In some embodiments the at least one analyte is a glycan, a peptide, an herbicide, or a pesticide. In some embodiments, the glycan is a phosphoglycan. In some embodiments, the peptide is a phosphopeptide. In some embodiments, the herbicide is glyphosate.

Mobile Phase

The process for performing SEC and anion exchange chromatography as disclosed herein comprises flowing a mobile phase through an immobilized stationary phase for a period of time. The mobile phase generally comprises water, a buffer, and optionally one or more salts. In certain specific embodiments, the mobile phase and, optionally the sample, are provided by a high performance liquid chromatography (HPLC) system.

Buffers serve to control the ionic strength and the pH of the mobile phase. Many different substances may be used as buffers depending on the nature of the analyte. Non-limiting examples of suitable buffers include phosphates, tris(hydroxymethyl)aminomethane, and acetates. In some embodiments, the buffer comprises phosphate. In some embodiments, the buffer comprises acetate. In some embodiments, the buffer is ammonium acetate. In some embodiments, the buffer is an alkali metal phosphate. In some embodiments, the buffer is a sodium or potassium phosphate. In some embodiments, the buffer is sodium phosphate monobasic, sodium phosphate dibasic, or a combination thereof. The concentration of the buffer may vary depending on the desired pH and ionic strength of the mobile phase.

In some embodiments, the mobile phase comprises a salt. As used herein, the term "salt" refers to an ionic compound comprising an alkali or alkaline earth metal and a halogen (e.g., fluoride, chloride, bromide, iodide). Undesired interactions can be mitigated through utilizing a salt to reduce ionic secondary interactions. However, increasing the salt concentration can induce aggregation and thus lead to a decrease in native monomer, and the addition of high concentrations of salt can exacerbate hydrophobic interactions, and complicates mobile phase optimization. When present, suitable salts include, but are not limited to, sodium chloride and potassium chloride. Suitable concentrations of salts in the mobile phase may range from about 10 to about 200 mM.

As described herein above, embodiments of the methods, devices, and processes have been discussed in connection primarily with SEC separations and reduction or elimination of hydrophobic and ionic secondary interactions. One of skill in the art will recognize that other functionalities may be utilized in alternative embodiments, and other separation methods are contemplated herein which may utilize such functionalities, for example, hydrophobic interaction and other reverse-phase chromatographies.

All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

It will be readily apparent to one of ordinary skill in the relevant arts that suitable modifications and adaptations to the compositions, methods, and applications described herein can be made without departing from the scope of any embodiments or aspects thereof. The compositions and methods provided are exemplary and are not intended to limit the scope of the claimed embodiments. All of the various embodiments, aspects, and options disclosed herein can be combined in all variations. The scope of the compositions, formulations, methods, and processes described herein include all actual or potential combinations of embodiments, aspects, options, examples, and preferences herein.

Although the technology herein has been described with reference to particular embodiments, it is to be understood that these embodiments are merely illustrative of the principles and applications of the present technology. It will be apparent to those skilled in the art that various modifications and variations can be made to the method and apparatus of the present technology without departing from the spirit and scope of the technology. Thus, it is intended that the present technology include modifications and variations that are within the scope of the appended claims and their equivalents.

Reference throughout this specification to "one embodiment," "certain embodiments," "one or more embodiments" or "an embodiment" means that a particular feature, structure, material, or characteristic described in connection with the embodiment is included in at least one embodiment of the technology. Thus, the appearances of phrases such as "in one or more embodiments," "in certain embodiments," "in one embodiment" or "in an embodiment" in various places throughout this specification are not necessarily referring to the same embodiment of the technology. Furthermore, the particular features, structures, materials, or characteristics may be combined in any suitable manner in one or more embodiments. Any ranges cited herein are inclusive.

Aspects of the present technology are more fully illustrated with reference to the following examples. Before describing several exemplary embodiments of the technology, it is to be understood that the technology is not limited to the details of construction or process steps set forth in the following description. The technology is capable of other embodiments and of being practiced or being carried out in various ways. The following examples are set forth to illustrate certain aspects of the present technology and are not to be construed as limiting thereof.

EXAMPLES

The present invention may be further illustrated by the following non-limiting examples describing the chromatographic devices and methods.

Materials

All reagents were used as received unless otherwise noted. Those skilled in the art will recognize that equivalents of the following supplies and suppliers exist and, as such, any suppliers listed below are not to be construed as limiting.

Methods

Example 1

$C_2$-$C_{10}$ Vapor Deposition Coating (Primer)

Metal components are subjected to vapor deposition of an organosilane reagent to form a primer layer. Prior to coating, all metal components are passivated according to a nitric acid passivation. Passivated parts and a silicon wafer are then introduced to a vapor deposition chamber and vacuum is established. The first step is a plasma cleaning step. Next is the first vapor deposition cycle. Each vapor deposition cycle comprises an organosilane vapor deposition, followed by the introduction of water vapor for organosilane hydrolysis. The organosilane vapor is delivered at a first pressure, and then the water vapor is delivered at a second pressure. Following delivery, the organosilane and water are left to react with the substrate. This cycle is repeated to produce the desired number of layers and coating thickness. In this example, bis(trichlorosilyl)ethanesilane is used to build up an adhesion or primer layer of approximately 800 Å. A post-coating annealing step can be used to further cross-link and increase the hydrophobicity of the coating. Typically, the annealing cycle involves subjecting the coating to an elevated temperature under vacuum.

A silicon wafer is used as a coupon to measure the thickness and contact angle of the coating. To measure the thickness, a Gaertner Scientific Corporation stokes ellipsometer model LSE is used. By analyzing the change in polarization of light, and comparing to a model, the film thickness can be established.

Example 2

PEG Liquid Phase Deposition Coating on Vapor Phase Coating (C2PEG)

The coated metal components prepared according to Example 1 are treated with a solution of a polyethyleneglycol (PEG) organosilane reagent. In this case, C2-coated 4.6 mm, 0.2 µm porous titanium frits were stirred with a dilute toluene solution of the organosilane reagent; for example 2-[methoxy(polyethyleneoxy)$_{6-9}$propyl]tris(dimethylamino)silane; Gelest SIM6492.77). The reagent solution was allowed to react with the frits for approximately three days. The solution was discarded, and the frits washed (dipped) in toluene three times, and in isopropanol three times. The frits were vacuum dried at 70° C., then cooled.

Example 3

PEG Liquid Phase Deposition Coating Alone (Reference)

Ten uncoated 4.6 mm, 0.2 µm porous titanium frits were added to a bottle containing a dilute organosilane solution; for example 2-[methoxy(polyethyleneoxy)$_{6-9}$propyl]tris(dimethylamino)silane; Gelest SIM6492.77) in toluene. The reagent solution was allowed to react with the frits for approximately three days. The solution was discarded, and the frits washed (dipped) in toluene three times, and in isopropanol three times. The frits were vacuum dried at 70° C., then cooled.

Example 4

Evaluation of Secondary Interactions-SEC Conditions, No Column

The porous titanium frits prepared according to Examples 1, 2, and 3 were separately loaded into an HPLC system (ACQUITY® UPLC® H-Class Bio system; available from Waters Corporation, Milford, MA) without a column and tested under H-Class Bio filter assembly parameters, using a mobile phase and a protein standard consistent with SEC applications. The parameters were as follows:

Sample: Intact mAb mass check standard, 0.667 mg/mL
Sample Diluent: 25 mM sodium phosphate pH 6.8, 75 mM sodium chloride
Mobile Phase: 25 mM sodium phosphate pH 6.8, 75 mM sodium chloride
Needle Wash: 90/10 Water Methanol
Injection Volume: 0.5 microliters (0.33 micrograms)
UV Wavelength: 280 nm
Flow Rate: 0.15 mL/min
30° C.

Figure 4:
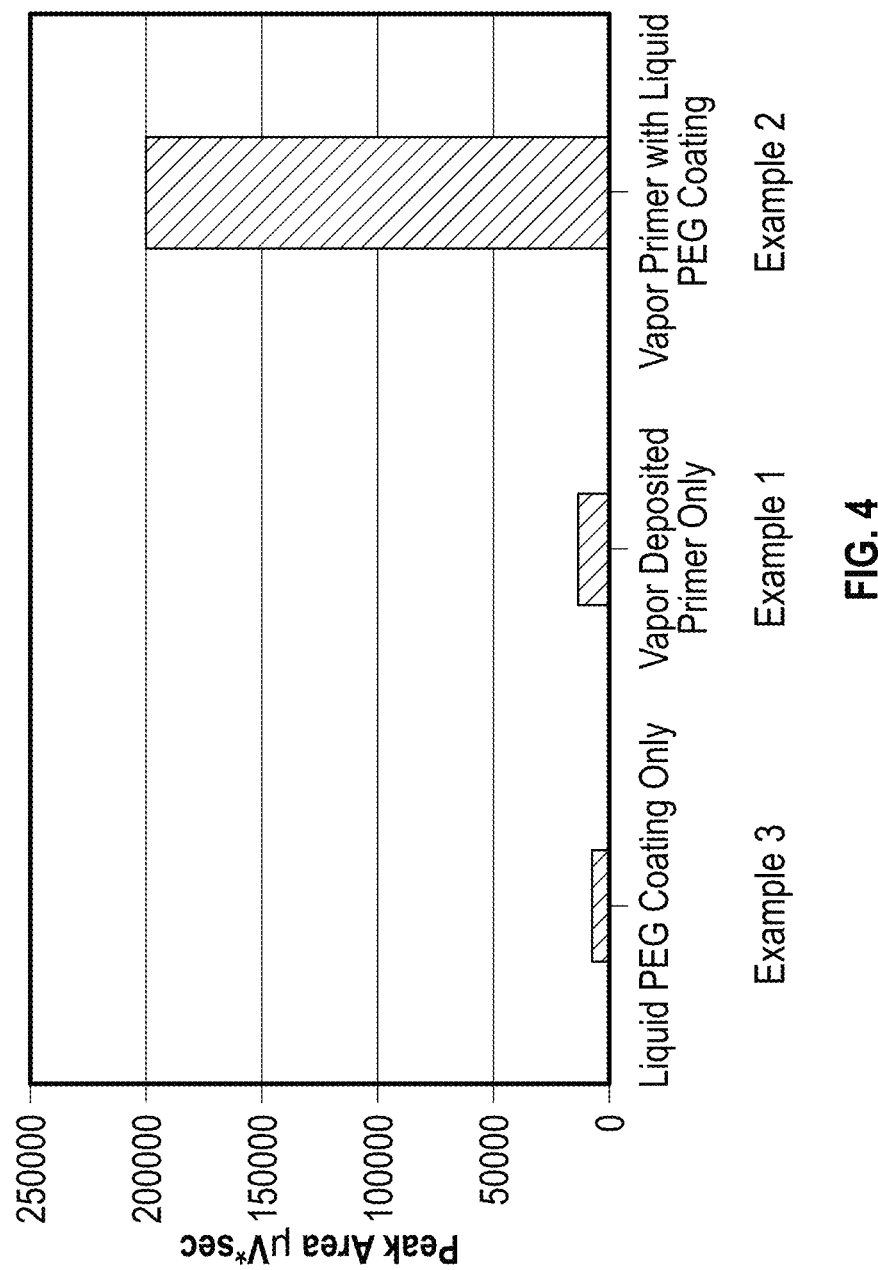
FIG. 4 is a bar graph depicting exemplary recovery by peak area of a mAb analyte standard in an SEC system without a column using a coated frit according to an embodiment of the disclosure, and for two reference frits.
Figure 5:
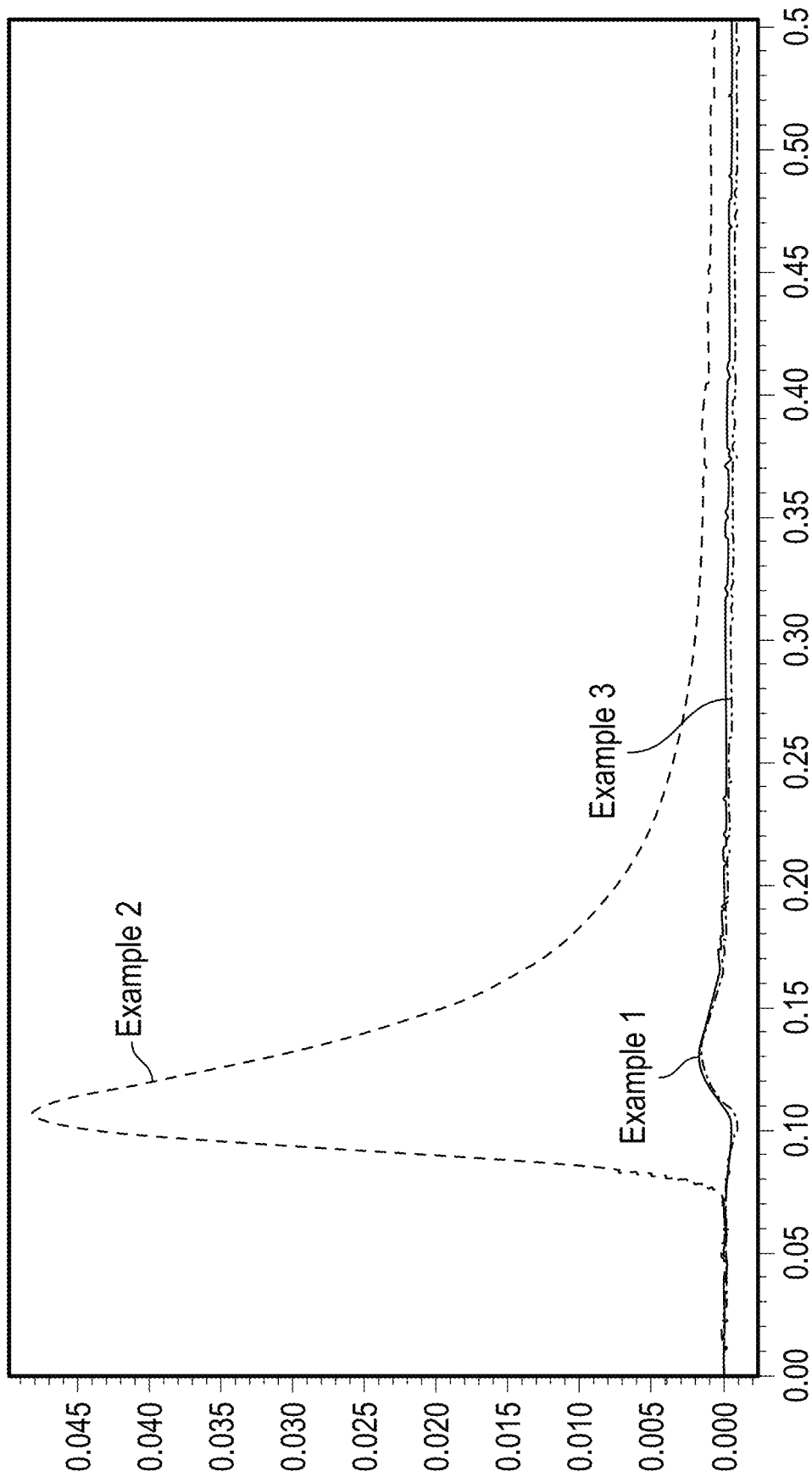
FIG. 5 depicts an exemplary detector response to a mAb analyte standard in an SEC system without a column and using a coated frit according to an embodiment of the disclosure, and for two reference frits.
Figures 8P, 8Q, 8R, 8S, 8T:
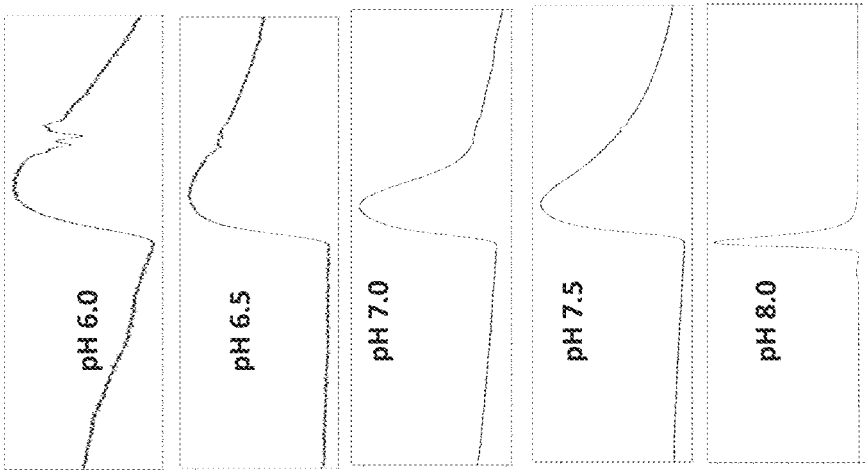
FIGS. 8A-8T depict exemplary chromatographic separations of Trastuituanab emtansine (Kadcyla; Genentech) performed with different mobile phases (pH 6.0 to 8.0 and NaCl concentrations from 0 to 200 mM) on a prototype hydroxy-terminated PEG surface-modified, inorganic-organic hybrid particle SEC column in a system using a reference stainless steel frit.
Figures 8K, 8L, 8M, 8N, 8O:
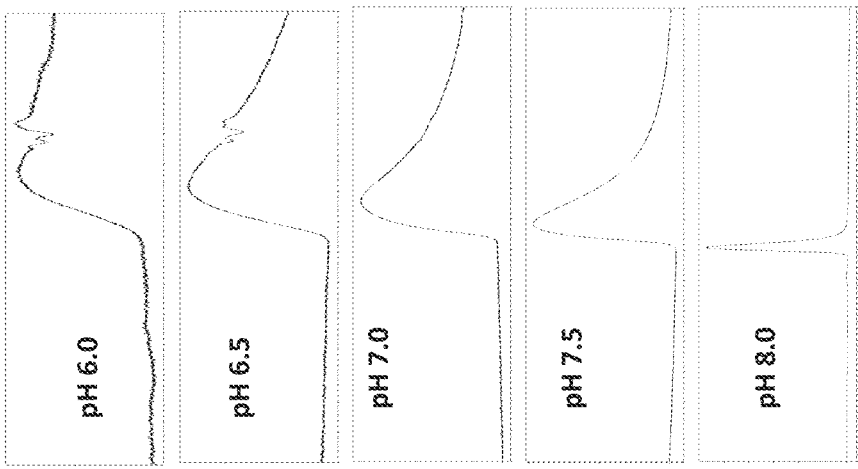

The results, provided in FIG. 4, demonstrated that protein recovery was maximized with the two-step coating process according to Example 2 under these measurement conditions. Specifically, the combination of the vapor deposited primer with the liquid PEG coating process resulted in the lowest protein adsorption. Without wishing to be bound by theory, it is believed that the vapor deposition resulted in a much more reactive surface that readily accepted the liquid phase PEG silane through hydrolysis/condensation reactions, resulting in a reduction in non-specific protein binding. In the absence of the primer layer (Example 3), the PEG silane failed to bond to the native metal oxide layer, resulting in a mostly uncoated metal surface that bound to proteins through secondary (ionic) interaction. The primer layer alone (Example 1) resulted in a surface that also bound to proteins through non-specific binding sites, resulting in poor protein recovery as shown in the representative chromatogram of FIG. 5. In contrast, the frit prepared according to Example 2 (vapor phase primer and solution phase PEG) maximized the protein recovery as indicated by the large analyte peak (FIG. 5).

Example 5

Evaluation of Secondary Interactions-SEC

The performance of reference (untreated) standard stainless steel hardware and hardware coated according to Example 2 was evaluated in SEC separation using a prototype SEC column (hydroxy-terminated polyethylene glycol surface modified hybrid particles). The stationary phase particles were prepared as follows.

Organic/inorganic hybrid particles with an empirical formula $SiO_2(O_{1.5}SiCH_2CH_2SiO_{1.5})_{0.25}$ were synthesized in a sol-gel synthesis by the co-condensation of 1,2-bis(triethoxysilyl)ethane (BTEE) with tetraethyl orthosilicate (TEOS) using the procedures reported in Wyndham et al., Analytical Chemistry 2003, 75, 6781-6788 and U.S. Pat. No. 6,686,035, each of which is incorporated herein by reference in its entirety. The obtained inorganic-organic hybrid ethylene bridged particles had an average particle size of 1.7 µm and an average pore diameter of 270 Å. The surface area was 171 $m^2/g$, and the pore volume was 1.26 $cm^3/g$. The inorganic-organic hybrid ethylene bridged particles were then bonded to form the hydroxy-terminated PEG bonded stationary phase particles. The inorganic-organic hybrid ethylene bridged particles were dispersed in toluene (10 mL/g). The residual water was removed from the material by azeotropic distillation (110° C., 1-2 h). The reaction temperature was reduced below 40° C. and concentrated hydrochloric acid (200 µL/g particles) was added, followed by [hydroxy (polyethyleneoxy)$_{8-12}$propyl]triethoxysilane (8 µmol/m$^2$). The reaction was stirred for 5 min and the temperature was increased to 110° C. for 20 h. The reaction was then cooled to RT and the particles were isolated via filtration. The particles were subsequently washed using the following sequence: 5×toluene, 1×acetone, 4×acetone/water (1:1 v/v), and 2×acetone. Following the bonding reaction, hydrolysis of remaining ethoxysilyl groups was performed with ammonium acetate. The particles were dispersed in a mixture of acetone (8.2 mL/g particle) and 0.12 M ammonium acetate solution (1.8 mL/g particle), and the mixture was stirred at 59° C. for 2 h. The reaction was then cooled <40° C. and the particles were isolated via filtration. The isolated particles were subsequently washed three times with acetone/water (1:1 v/v) and twice with acetone. The isolated, surface modified particles were dried under vacuum at 70° C. for 16 h. The surface coverage of the hydroxy-terminated PEG was 1.73 µmol/m$^2$. The hydroxy-terminated PEG bonded stationary phase particles were loaded in a 4.6×150 mm column.

The separations were performed using a commercially available high performance liquid chromatography (HPLC) system (ACQUITY® UPLC® H-Class Bio system; available from Waters Corporation, Milford, MA). The primary constituent of the mobile phase was 40 mM sodium phosphate at pH 6-8 with 0-200 mM sodium chloride. The analytes were either BEH200 protein standard mix (thyroglobulin, IgG, BSA, myoglobin, and uracil) or trastuzumab emantansine (Kadcyla).

The results for SEC of the BEH200 Protein Standard Mix using the reference hardware and hardware coated according to Example 2 are provided in FIGS. 6A to 6T and FIGS. 7A to 7T, respectively. Specifically, for the reference hardware, FIGS. 6A to 6E are chromatograms performed with a mobile phase without NaCl, at pH values from 6.0 to 8.0; FIGS. 6F to 6J are chromatograms performed with a mobile phase with 50 mM NaCl, at pH values from 6.0 to 8.0; FIGS. 6K to 6O are chromatograms performed with a mobile phase with 100 mM NaCl, at pH values from 6.0 to 8.0; and FIGS. 6P to 6T are chromatograms performed with a mobile phase with 200 mM NaCl, at pH values from 6.0 to 8.0. For the coated hardware, FIGS. 7A to 7E are chromatograms performed with a mobile phase without NaCl, at pH values from 6.0 to 8.0; FIGS. 7F to 7J are chromatograms performed with a mobile phase with 50 mM NaCl, at pH values from 6.0 to 8.0; FIGS. 7K to 7O are chromatograms performed with a mobile phase with 100 mM NaCl, at pH values from 6.0 to 8.0; and FIGS. 7P to 7T are chromatograms performed with a mobile phase with 200 mM NaCl, at pH values from 6.0 to 8.0. The chromatograms therein demonstrated that the coated hardware greatly improved the peak shape and peak area under less than ideal mobile phase conditions, and the coated hardware was less dependent on salt concentration or pH. Further, a low buffer concentration (e.g., 40 mM) was sufficient for quality chromatography with little method development with typical proteins when the SEC separation was performed on a hydroxy-terminated polyethylene glycol bonded SEC particle column in combination with the coated hardware according to Example 2.

The results for SEC of the Kadcyla analyte using the reference hardware and hardware coated according to Example 2 are provided in FIGS. 8A-8T and FIGS. 9A-9T, respectively. Specifically, for the reference hardware, FIGS. 8A to 8E are chromatograms performed with a mobile phase without NaCl, at pH values from 6.0 to 8.0; FIGS. 8F to 8J are chromatograms performed with a mobile phase with 50 mM NaCl, at pH values from 6.0 to 8.0; FIGS. 8K to 8O are chromatograms performed with a mobile phase with 100 mM NaCl, at pH values from 6.0 to 8.0; and FIGS. 8P to 8T are chromatograms performed with a mobile phase with 200 mM NaCl, at pH values from 6.0 to 8.0. For the coated hardware, FIGS. 9A to 9E are chromatograms performed with a mobile phase without NaCl, at pH values from 6.0 to 8.0; FIGS. 9F to 9J are chromatograms performed with a mobile phase with 50 mM NaCl, at pH values from 6.0 to 8.0; FIGS. 9K to 9O are chromatograms performed with a mobile phase with 100 mM NaCl, at pH values from 6.0 to 8.0; and FIGS. 9P to 9T are chromatograms performed with a mobile phase with 200 mM NaCl, at pH values from 6.0 to 8.0.

The chromatograms therein demonstrate that the coated hardware greatly improved the chromatography of the hydrophobic antibody drug conjugate Kadcyla. Further, the coated hardware allowed for a greater degree of freedom with respect to mobile phase composition. Specifically, Kadcyla peaks were observed with the coated hardware under conditions that generated no peaks when the uncoated reference hardware was used. A weakly buffered mobile phase was sufficient for this challenging analyte when the SEC separation was performed on prototype hydroxy-terminated polyethylene glycol surface-modified, hybrid particle column combined with the coated hardware.

In particular, the results shown in FIGS. 7A-7T and FIGS. 9A-9T demonstrate the noted advantages associated with the of the coated hardware combined use with a prototype hydroxy-terminated polyethylene glycol surface-modified, hybrid particle column.

Example 6

Evaluation of Protein Adsorption of Various Porous Materials

Protein adsorption can limit accuracy and precision of chromatographic separations. Accordingly, minimal protein adsorption is desirable for more accurate and precise SEC analyses. Proteins tend to stick to various materials through ionic and hydrophobic interactions, particularly in aqueous mobile phases used in SEC. To gain an understanding of the hydrophobicity of various materials and to determine if there was a correlation between protein adsorption and hydrophobicity, experiments were performed to evaluate protein recovery from several LC filter assemblies. Specifically, the following 4.6 mm filter assemblies were evaluated:

- 0.2 µm Titanium (reference)
- 0.2 µm Titanium with C2 coating (reference)
- 0.2 µm Titanium with C2-PEG coating (inventive; prepared by coating a titanium frit according to Examples 1 and 2)
- 0.2 µm Titanium with C2-C10 coating (reference)
- 0.2 µm 316 Stainless Steel (reference)
- 0.5 µm PEEK (Polyether ether ketone; reference)

Injections of an intact mAb mass check standard (mouse IgG1; Waters PN 186006552) were performed using a custom filter holder on an HPLC system (ACQUITY® UPLC® H-Class Bio system; available from Waters Corporation, Milford, MA). The testing parameters are provided in Table 1.

TABLE 1

| Instrument Test Parameters | |
|---|---|
| Mobile Phase | 25 mM Sodium Phosphate pH 6.8, 75 mM Sodium Chloride |
| Flow Rate | 0.15 mL/min |
| Gradient | Isocratic |
| Seal Wash | 90/10 Water/Methanol |
| Acquisition Time | 1 minute |
| Sample Temperature | 4° C. |
| Filter assembly Temperature | 30° C. |
| Injection Volume | 1.7 µL |
| Sample Diluent | 25 mM Sodium Phosphate pH 6.8, 75 mM Sodium Chloride |
| Wavelength | 280 nm |
| Sampling Rate | 20 points/sec |

One of each filter assembly type was placed inside the filter holder, and 10 injections of the intact mAb mass check standard were performed. For each injection, the standard recovery was calculated by dividing the peak area of each injection by the average peak area of the system using the formula:

$$\% \text{ Recovery} = \left(\frac{\text{Test part peak area}}{\text{peak area obtained from system}}\right) \times 100\%$$

The system peak area was determined by removing the frit holder and replacing it with a low volume union. The average area of 10 injections was used as the peak area obtained from the system. The recovery values of the intact mAb were plotted for each injection and each filter assembly type (FIG. 10). As demonstrated in FIG. 10, all the materials besides the C2-PEG coating exhibited an increase in intact mAb recovery over multiple injections. Without wishing to be bound by theory, it is believed that this increase in recovery may be attributed to a gradual loading of the filter assembly with the intact mAb, which limits the effect of further intact mAb adsorption. In some cases, the recovery plateaued at lower than 100% recovery, which is indicative of a dynamic balance between protein (intact mAb) adsorption and desorption. The inventive C2-PEG coating allowed for maximal recovery from the $1^{st}$ injection through the $10^{th}$ injection, signifying minimal adsorption.

Example 7

Contact Angle Determinations

The contact angle, a measure of hydrophobicity, was determined for the various reference and coated materials utilized in the filter assemblies of Example 6. A flat planar coupon was acquired for each material to be evaluated. For the reference uncoated 316 stainless steel, a 2"×2" sample of sheet metal (#8 Finish, 0.06" thick) was cleaned with an anionic detergent solution (for example, a 1% solution of Alconox®, available from Alconox Inc., White Plains, NY, USA), rinsed with deionized water, blown dry with nitrogen, and the contact angle immediately determined. For the reference uncoated Grade 2 titanium, a 2"×2" sample of sheet metal (dull finish, 0.063" thick) was washed, rinsed, and dried as described for the 316 stainless steel coupon. and the contact angle immediately determined. To obtain accurate readings for the coated surfaces, silicon wafers were coated according to the procedures of Examples 1 and 2, and the contact angles measured immediately after completion of the depositions.

Figure 11:
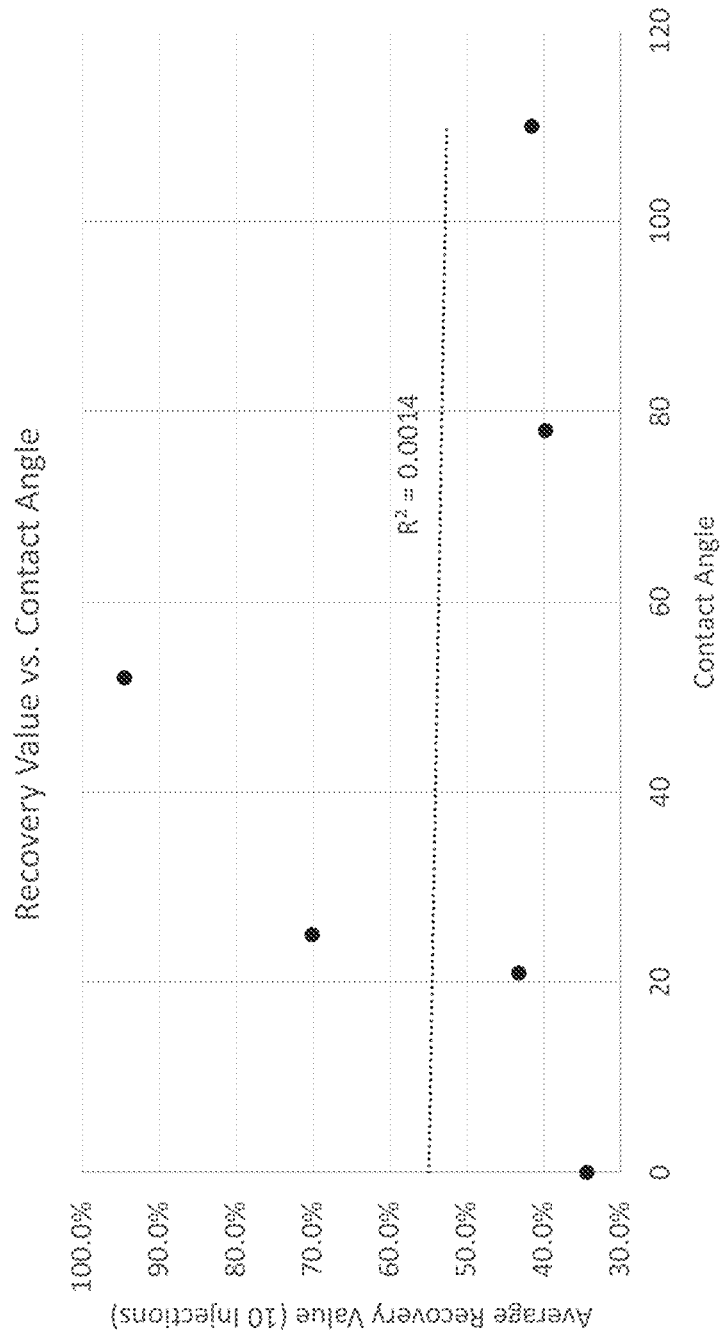
FIG. 11 is a chart depicting exemplary % recovery versus contact angle for reference materials and a material prepared according to an embodiment of the disclosure.
Figure 12A:
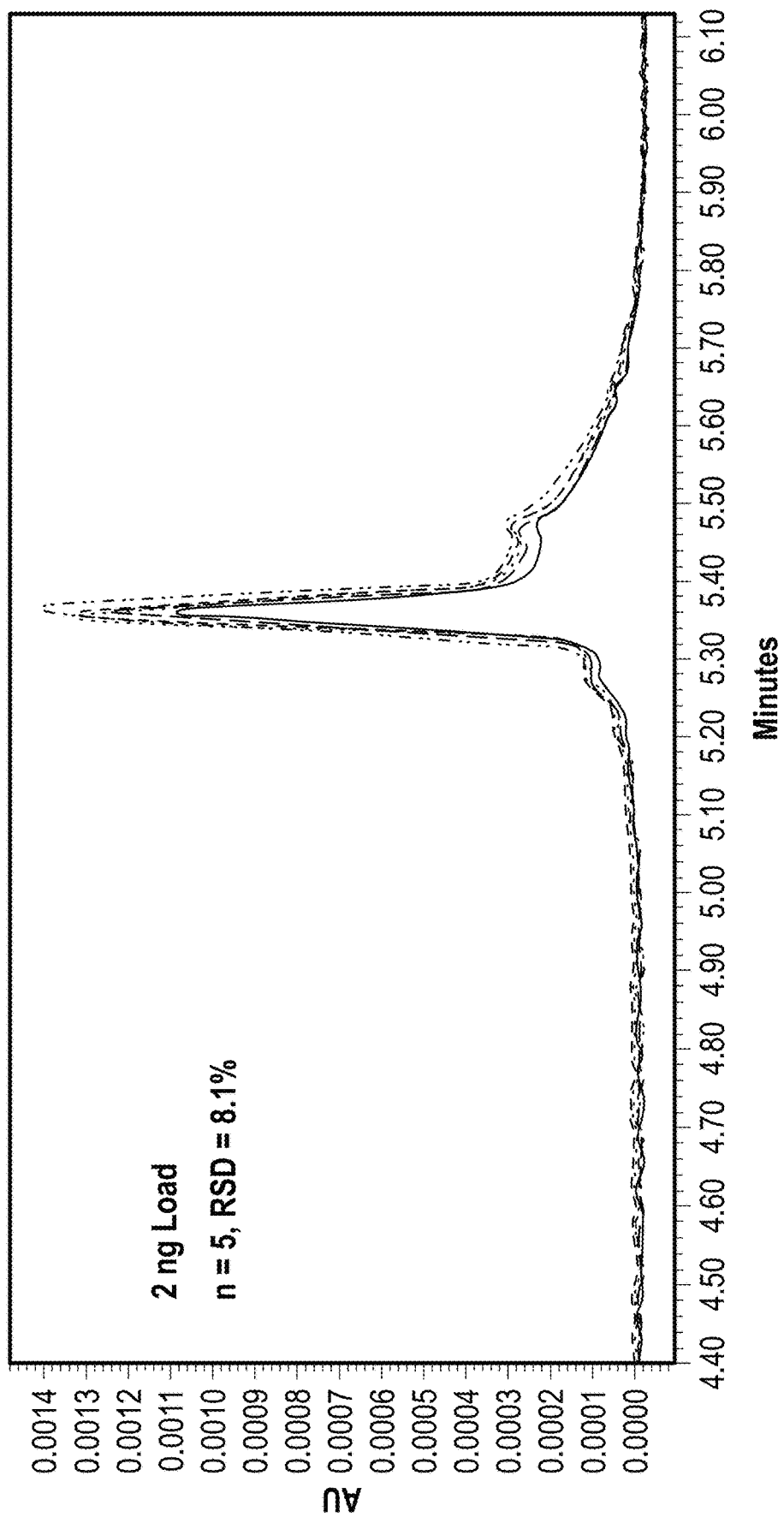
FIGS. 12A-12D depict exemplary chromatographic separations of EPO mRNA on a C2PEG coated hardware anion exchange column according to an embodiment of the disclosure with a series of repeat injections at increasing mass load.
Figure 12B:
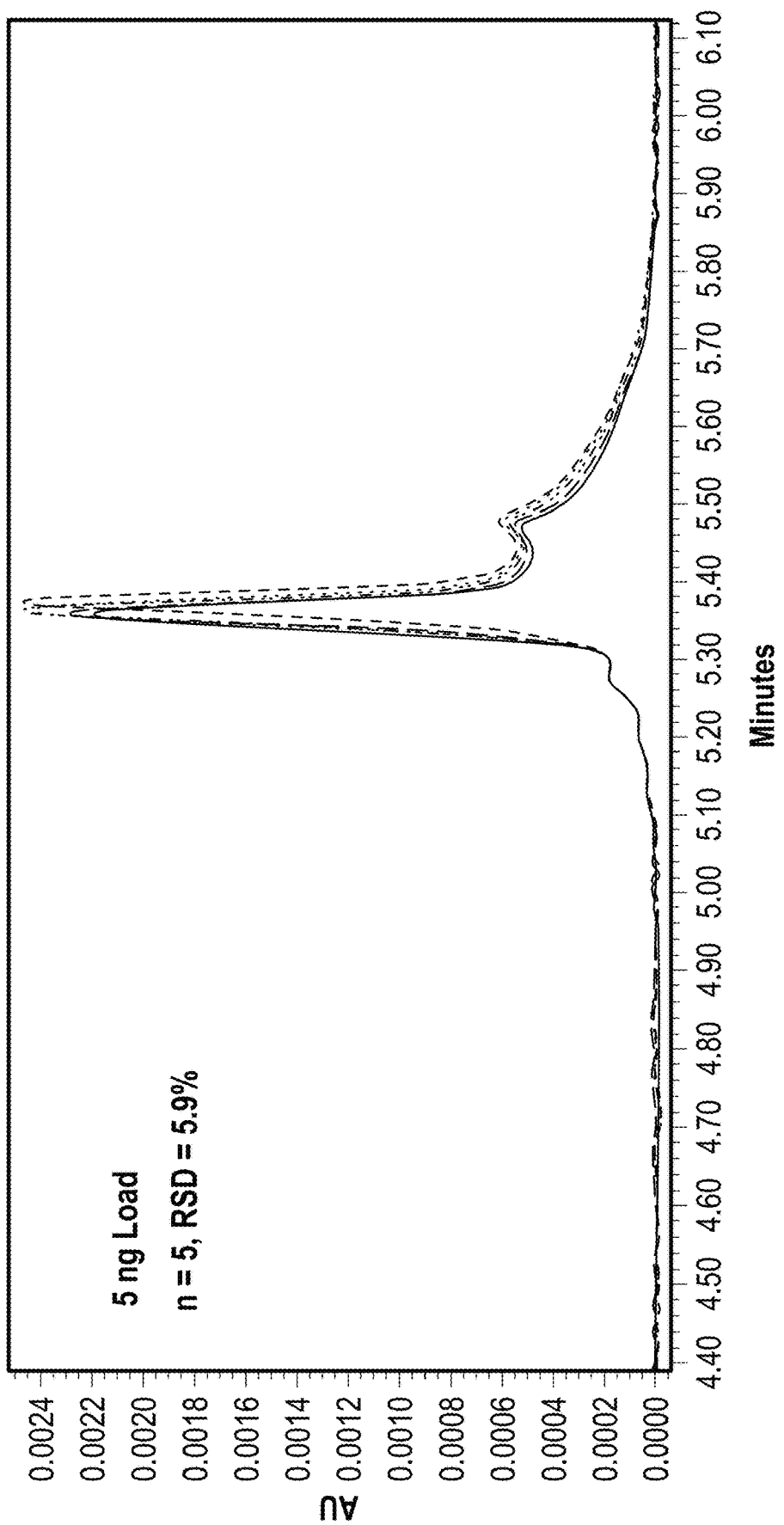
Figure 12C:
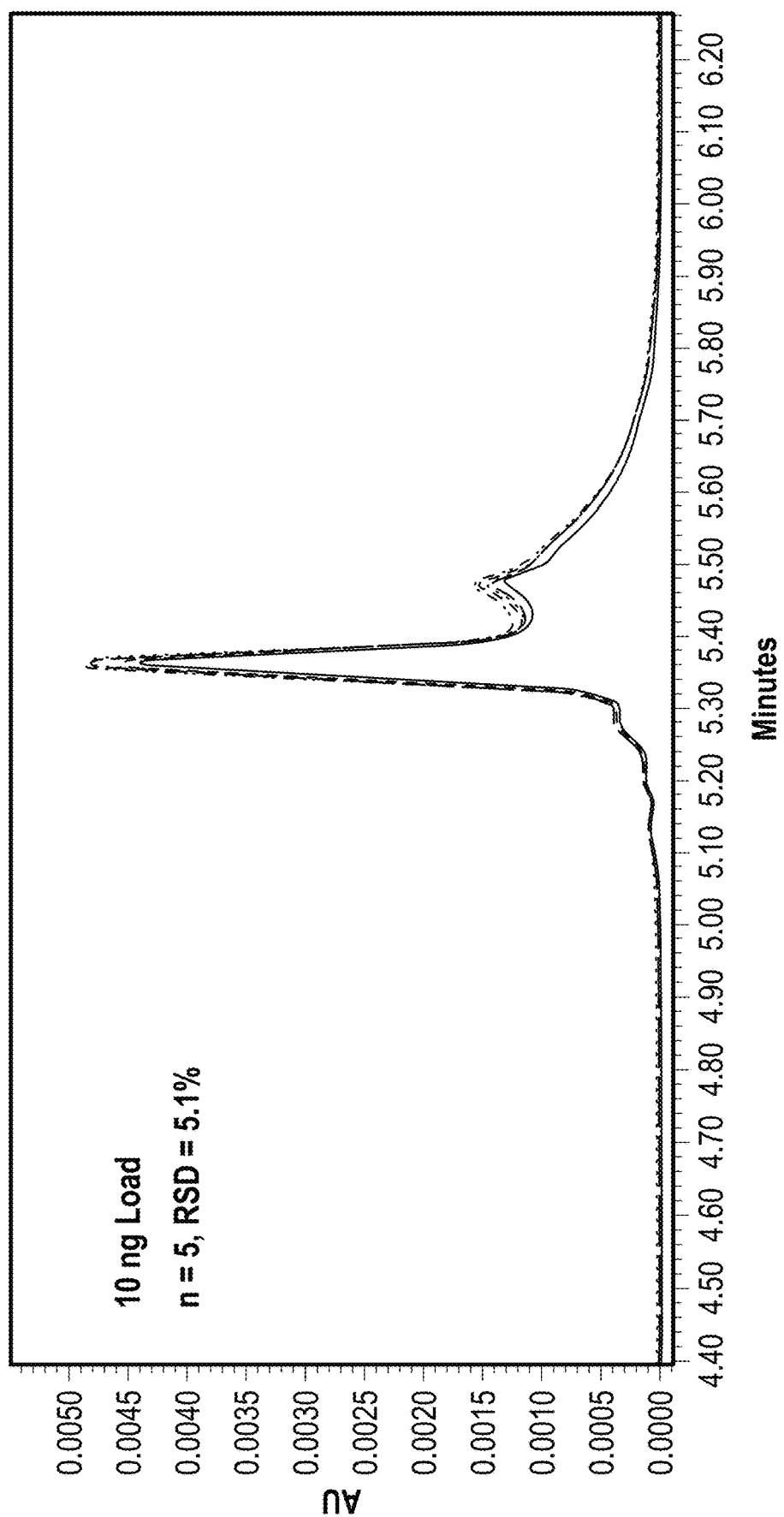
Figure 12D:
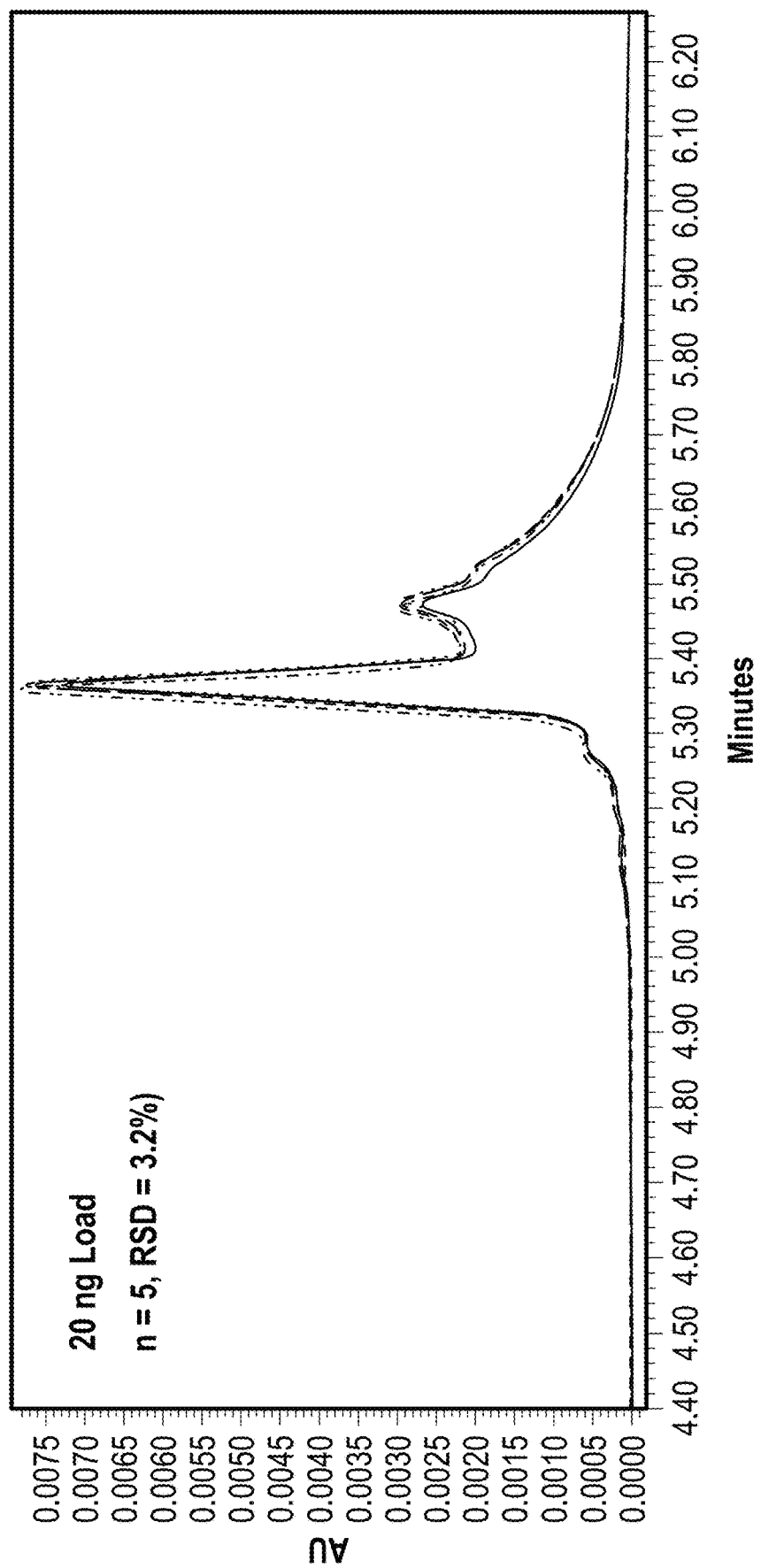
Figure 12E:
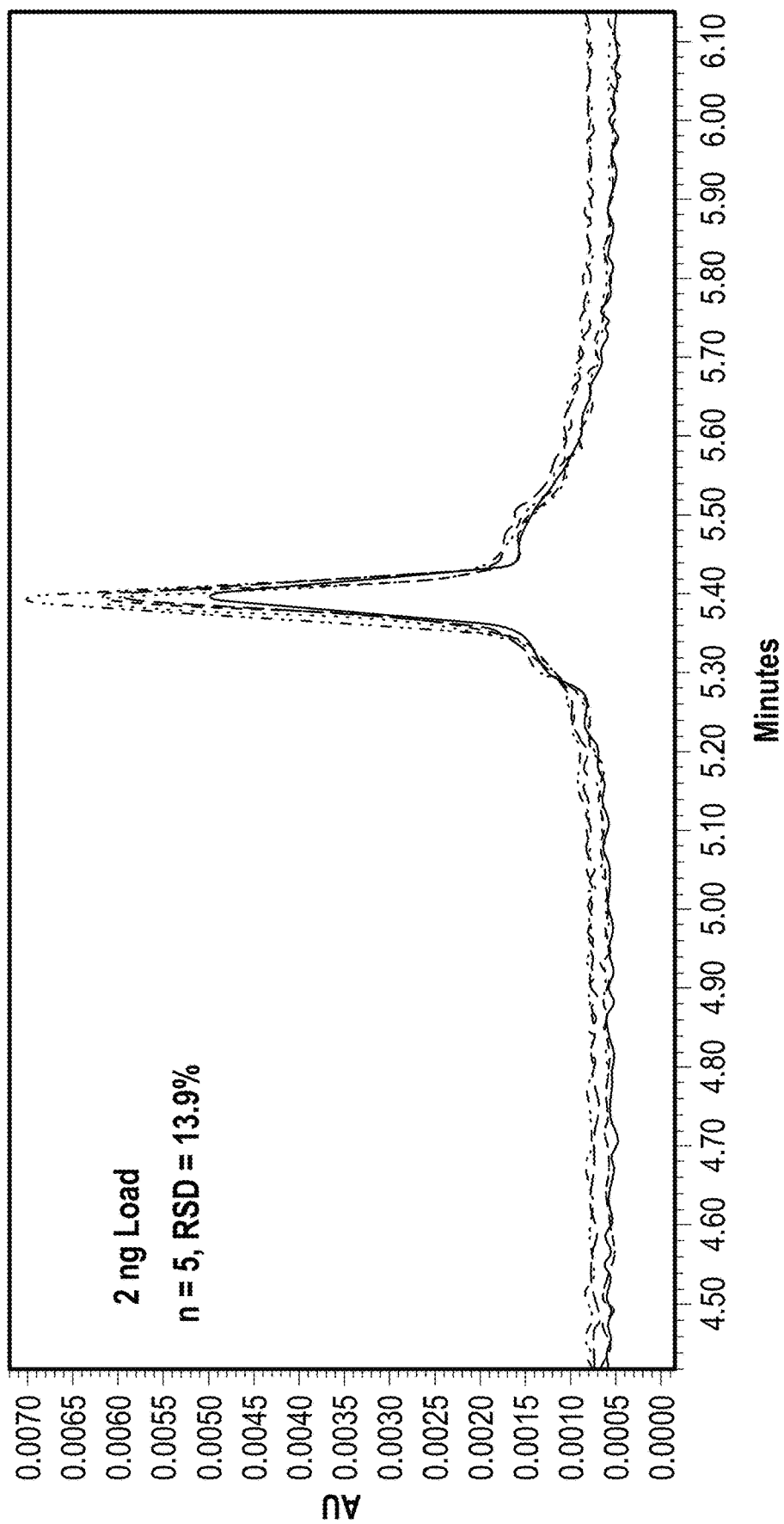
FIGS. 12E-12H depict exemplary chromatographic separations of EPO mRNA on a reference metal hardware anion exchange column with a series of repeat injections at increasing mass load.
Figure 12F:
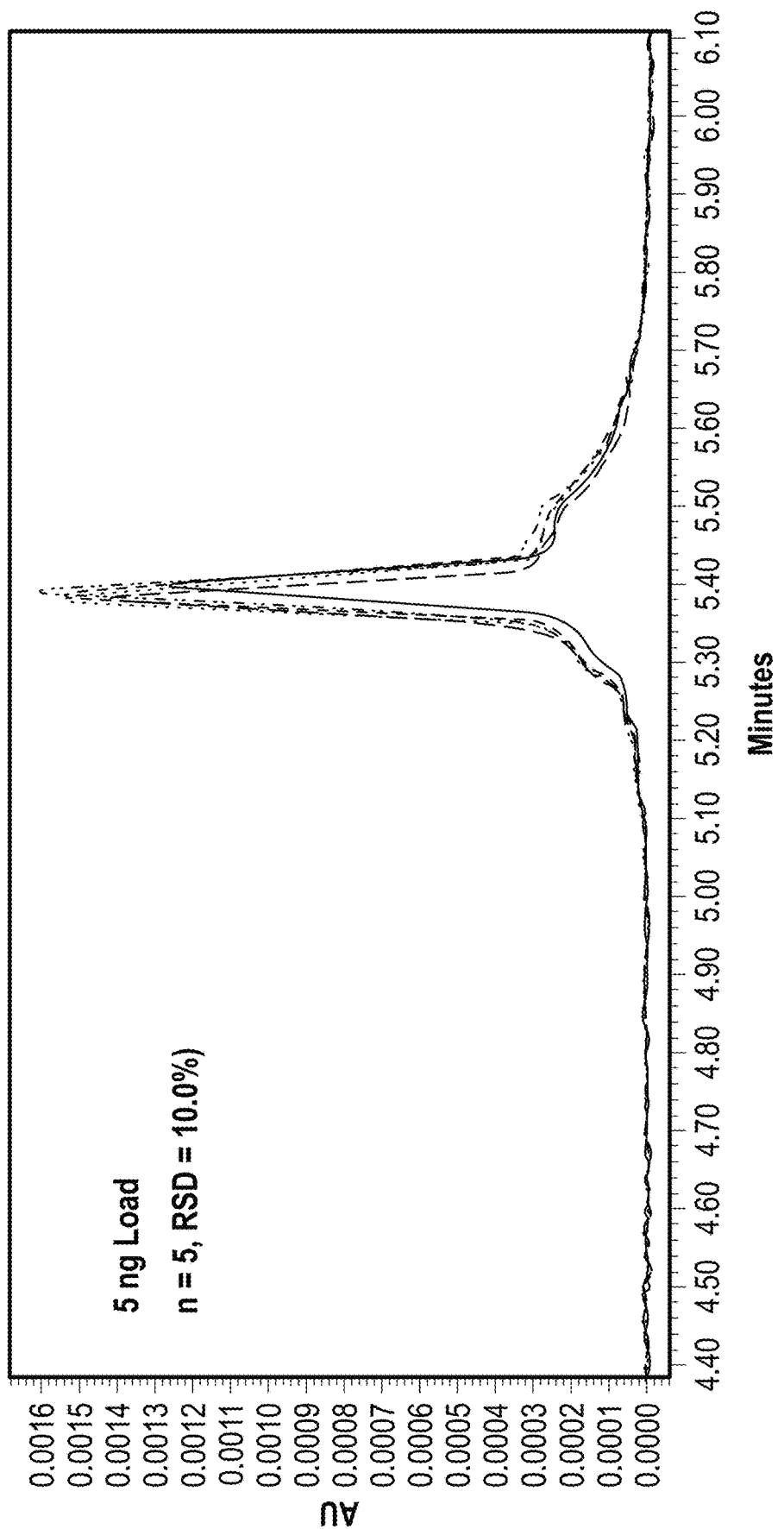
Figure 12G:
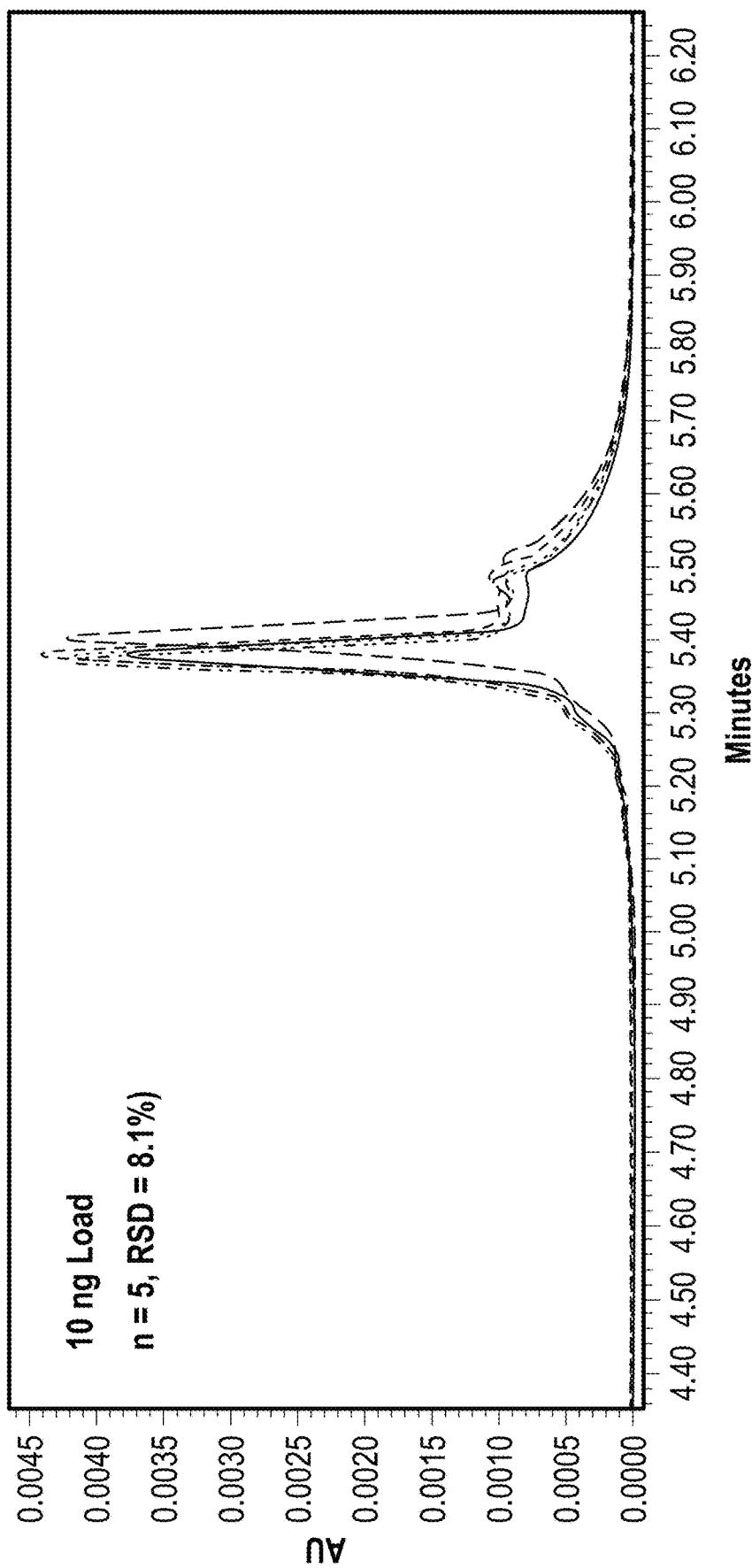
Figure 12H:
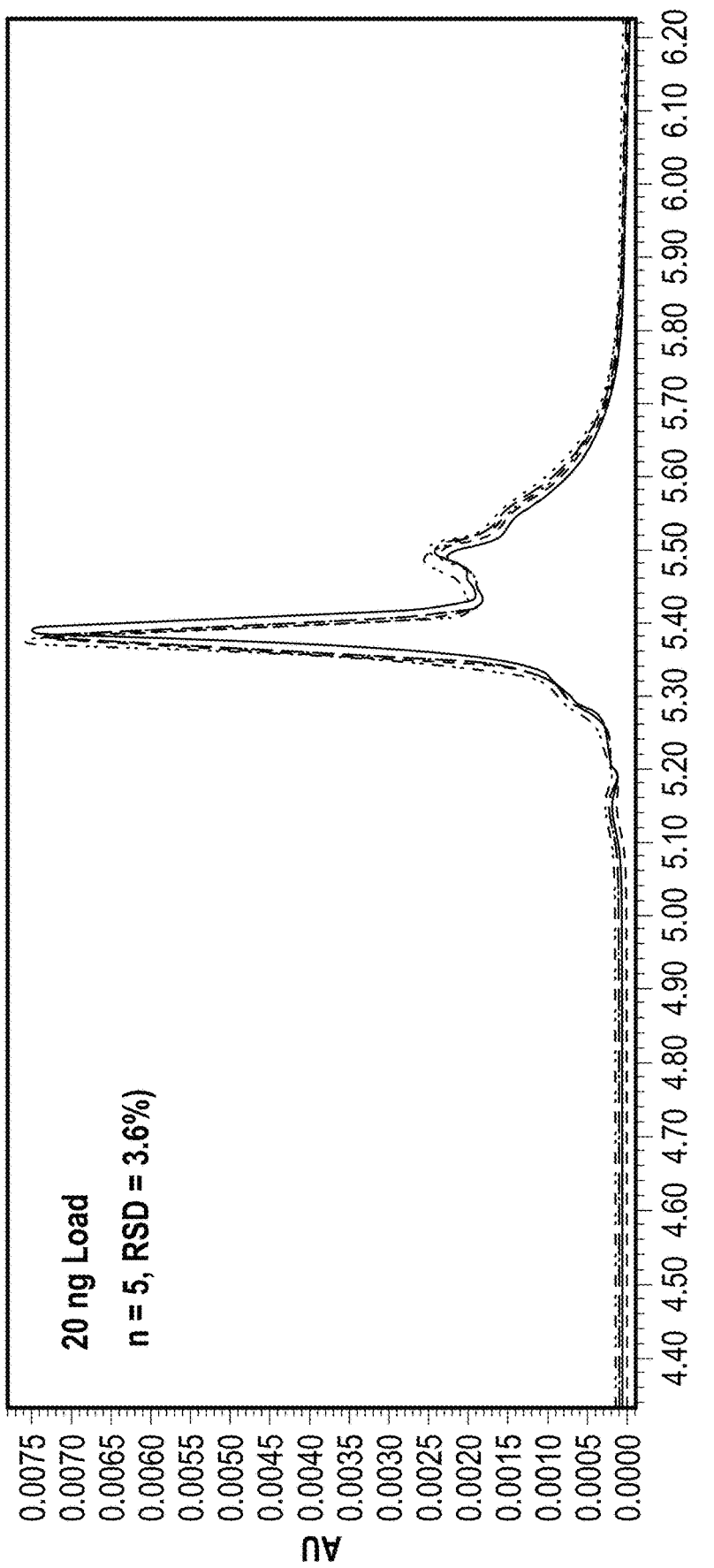

For each coupon, the contact angle was measured using a Rame-Hart goniometer or profilometer. In each instance, a ~3 µL drop of reverse osmosis-purified water was dispensed on the coupon surface and the resulting contact angle measurement was taken. The contact angle of each coupon is provided in Table 2. The average intact mAb recovery obtained in Example 6 above are also provided in Table 2. The relationship between contact angle and the average recovery value across the ten injections was plotted as illustrated in FIG. 11.

TABLE 2

Contact angle and average recovery

| Surface | Contact Angle | Average intact mAb Recovery n = 10 injections |
|---|---|---|
| Titanium (ref) | 0° | 34% |
| Stainless Steel (Ref) | 21° | 43% |
| C2 (Ref) | 25° | 70% |
| C2-PEG (inventive) | 52° | 95% |
| PEEK (Ref) * | 78° | 40% |
| C2-C10 (Ref) | 110° | 42% |

* Contact angle obtained from Wang et al., "PEEK surface modification by fast ambient-temperature sulfonation for bone implant applications" *Journal of the Royal Society Interface*, Published online 6 Mar. 2019.

With reference to FIG. 11 and Table 2, the data indicate that in general, there was no correlation between contact angle and protein adsorption. It is generally accepted that a hydrophilic surface is preferred for limiting hydrophobic protein adsorption, but clearly there are more factors involved, as surprisingly, the most hydrophilic surface (i.e., titanium) had the worst average recovery. In other words, the non-fouling characteristic of the C2-PEG coating cannot be fully explained on the basis of contact angle alone. For example, surface charge, surface roughness, and coating organization/morphology are some of the factors that cannot be detected with a contact angle measurement and which may further contribute to the non-fouling characteristic of the C2-PEG coating. In conclusion, the lack of protein (intact mAb) adsorption on the C2-PEG coated surface illustrates the performance gain that may be achieved in chromatographic separations by using hardware (e.g., filter frits) having this surface coating.

Example 8

Evaluation of Protein Adsorption of Various Porous Materials

Messenger RNAs (mRNAs) are important biomolecules. mRNAs are transcripts of DNA used by ribosomes to express new proteins. mRNA also represents a new class of advanced therapeutic medicinal products. For example, mRNA is now being used to vaccinate patients against SARS-CoV-2, the beta-coronavirus responsible for COVID-19 infection. Accordingly, there is a need to establish sensitive and precise methods to ensure that such mRNA therapeutics are well characterized ahead of clinical trials, and are that they are made reproducibly upon being granted approval for commercialization.

Anion exchange separations are a promising approach for measuring the heterogeneity of large polyanionic molecules such as mRNA. However, challenges are encountered when separating mRNA with traditional metal hardware LC columns. Particularly, with metal hardware columns, repeat injections of a given mass load tend to show RSD values for peak area that are greater than 10%. This lack of reproducibility in repeat analyses is problematic.

Accordingly, the performance of coated metal hardware columns prepared according to an embodiment of the disclosure was evaluated in representative anion exchange separations of mRNA samples. Specifically, salt gradient separations of two different mRNA samples (20 µg/mL of EPO mRNA or Cas9 mRNA, obtained from TriLink XYZ) were performed at mass loads ranging from 2 to 20 ng on a strong anion exchange column. The separations were performed on HPLC system (ACQUITY® UPLC® H-Class Bio Plus (Premier) system; available from Waters Corporation, Milford, MA) using either conventional metal hardware columns or C2-PEG coated metal hardware columns prepared according to the present disclosure. In each case, the mobile phase was a 5-micron particle size non-porous quaternary amine strong anion exchanger (Protein-Pak™ Hi Res IEX; column size 100 mm×4.6 mm; available from Waters Corporation, Milford, MA). The eluent comprised mobile phase A (25 mM tris(hydroxymethyl)aminomethane (TRIS); pH=7.5 (1.51 g TRIS base/0.5 L water) and mobile phase B (2M NaCl in mobile phase A (29.9 g NaCl/0.5 L "A") at a flow rate of 0.2 mL/min. Elution was with a gradient of 30-70% mobile phase B over 8 minutes. The injection volumes were 0.1, 0.2, 0.5 and 1 µL (5' replicates and repeat injections). Column temperature was 60° C. Detection was by UV absorbance monitored at a wavelength of 280 nm.

Figure 13A:
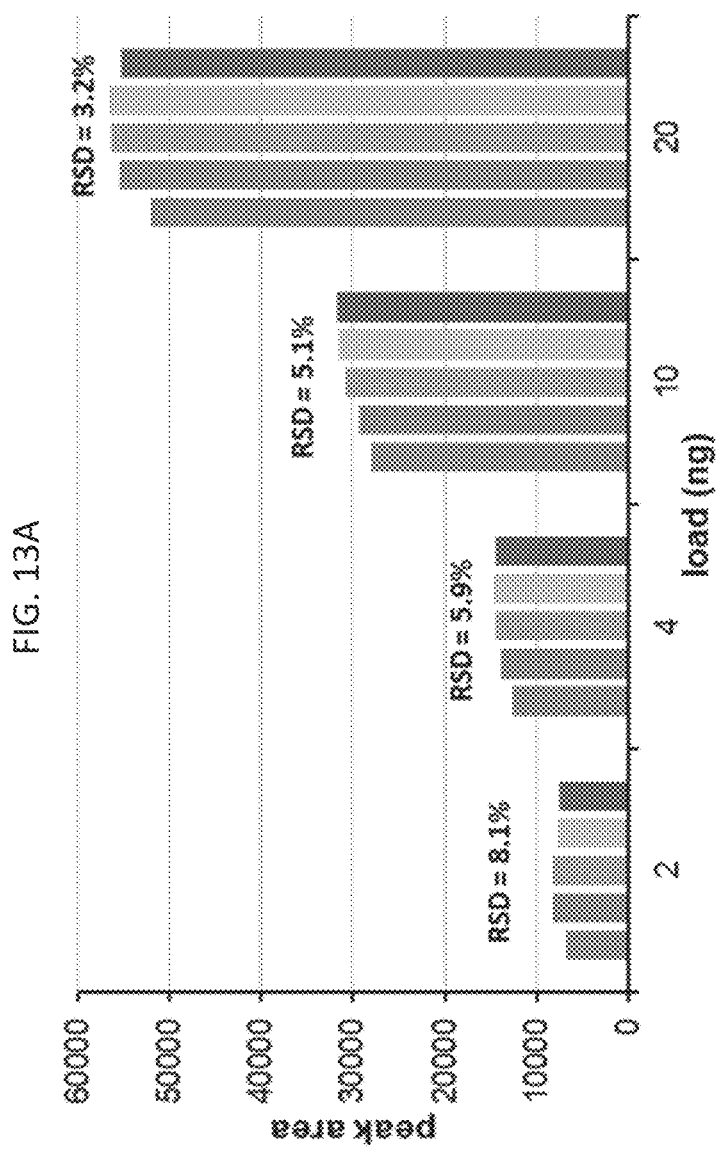
FIG. 13A is a chart depicting peak areas resulting from repeat injections and a subsequent anion exchange separation of EPO mRNA on a C2PEG coated hardware anion exchange column according to an embodiment of the disclosure.
Figure 13B:
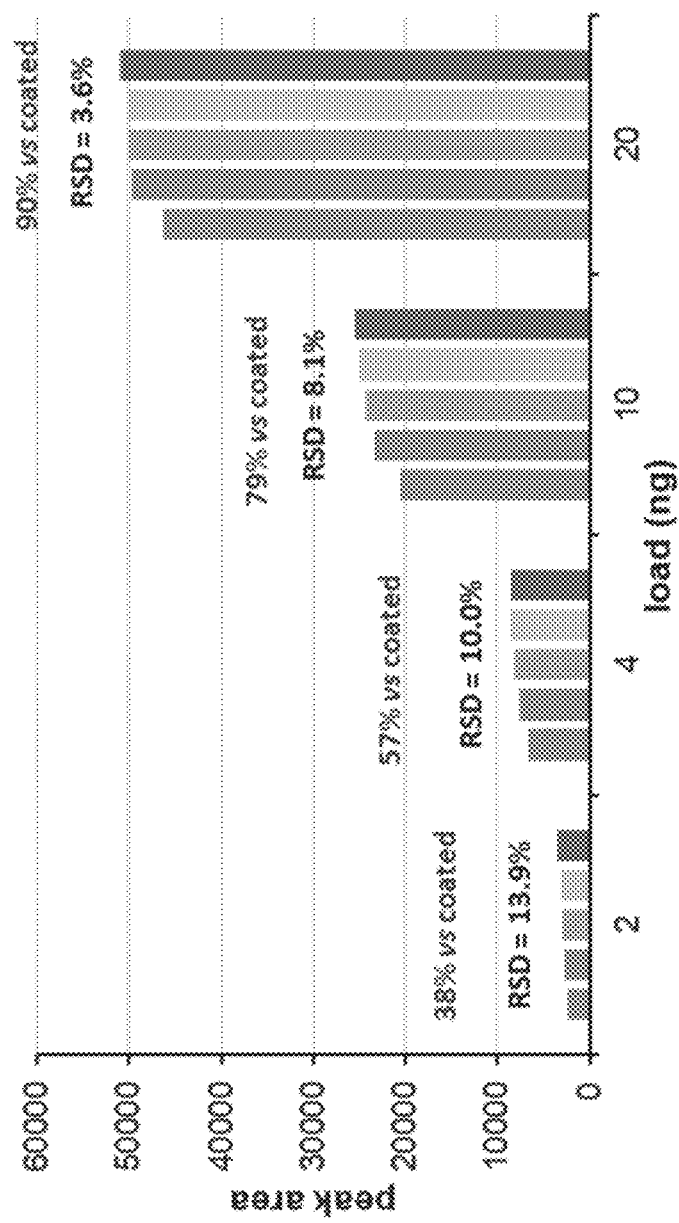
FIG. 13B is a chart depicting peak areas resulting from repeat injections and a subsequent anion exchange separation of EPO mRNA on a reference metal hardware anion exchange column.
Figure 14A:
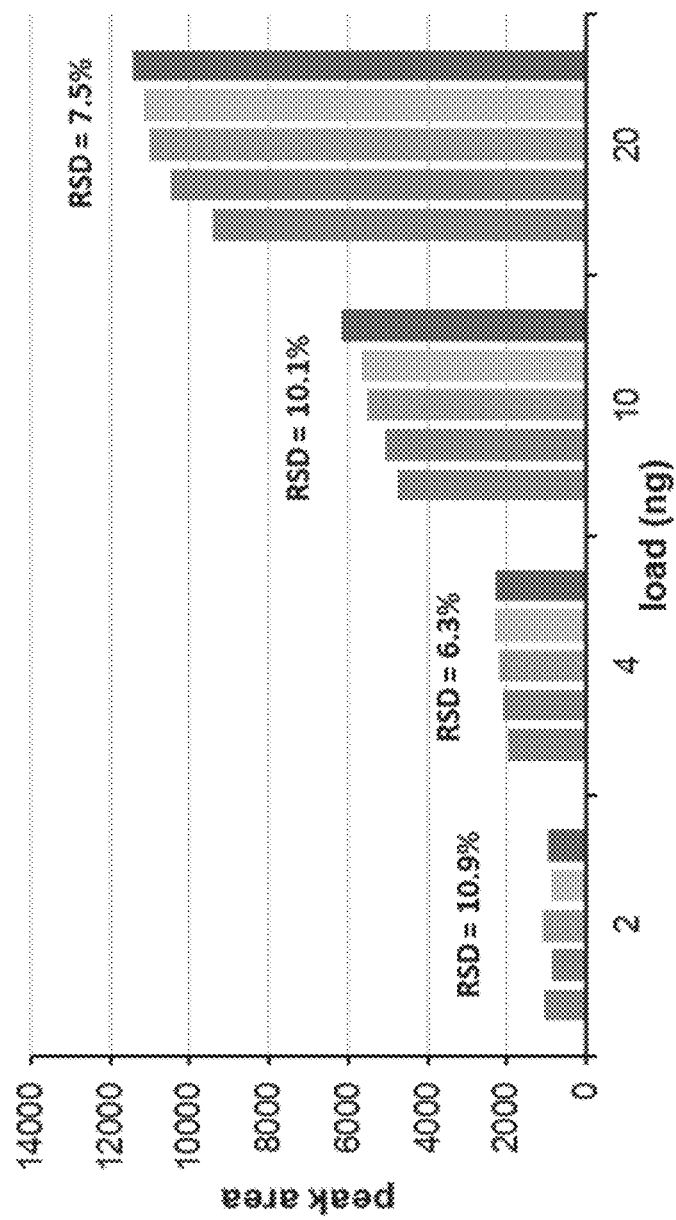
FIG. 14A is a chart depicting peak areas resulting from repeat injections and a subsequent anion exchange separation of Cas9 mRNA on a C2PEG coated hardware anion exchange column according to an embodiment of the disclosure.
Figure 14B:
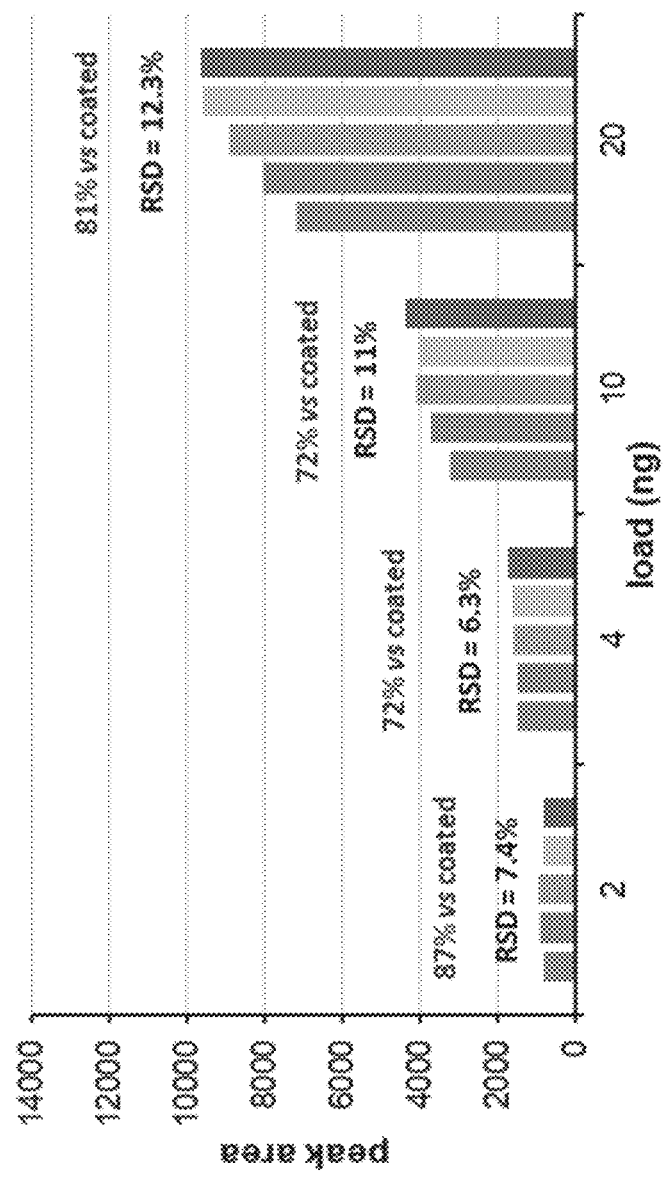
FIG. 14B is a chart depicting peak areas resulting from repeat injections and a subsequent anion exchange separation of Cas9 mRNA on a reference metal hardware anion exchange column.

Results for the separations of EPO mRNA with a series of repeat injections at increasing mass load are presented in FIGS. 12A-12H. Separations performed with a C2-PEG coated hardware anion exchange column of the present disclosure are provided in FIGS. 12A-12D. Separations performed with a reference metal hardware anion exchange column are provided in FIGS. 12E-12H. RSD values are reported for the 5 repeat injections at each given mass load. Peak areas resulting from repeat injections of EPO mRNA and a subsequent anion exchange separation are provided in FIGS. 13A and 13B for the C2-PEG coated hardware column and a reference metal hardware column, respectively. Peak areas resulting from repeat injections of Cas9 mRNA and a subsequent anion exchange separation are provided in FIGS. 14A and 14B for the C2-PEG coated hardware column and a reference metal hardware column, respectively.

Overall, the results obtained demonstrate that higher peak areas and thus higher recovery was achieved with each given mass load with the use of the C2-PEG coated hardware. Compared to the reference metal hardware columns, increases in peak area ranging from 15 to 200% were obtained through the use of the C2-PEG coated hardware surfaces. Along with improvements in recovery and consistency, it was noted that the C2-PEG coated hardware required less sample-based passivation.

The invention claimed is:

1. A method of modifying a fluidic flow path disposed within an interior of a fluidic system, the fluidic flow path having a wetted surface comprising hydroxyl groups, the method comprising:
   a. contacting the fluidic flow path with a vaporized organosilane reagent of Formula I

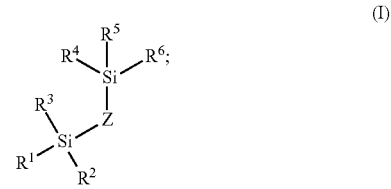

(I)

wherein:

R¹, R², R³, R⁴, R⁵, and R⁶ are each independently selected from the group consisting of $(C_1-C_6)$alkoxy, —NH$(C_1-C_6)$alkyl, —N$((C_1-C_6)$alkyl$)_2$, OH, and halo; and Z is $(C_1-C_{20})$alkyl, —[O(CH$_2$)$_2$O]$_{1-20}$, —[$(C_1-C_{10})$NH(CO)NH$(C_1-C_{10})$]$_{1-20}$—, or —[$(C_1-C_{10})$alkylphenyl$(C_1-C_{10})$alkyl]$_{1-20}$;

to form a first coating deposited on at least a portion of the wetted surface of the fluidic flow path; and b. contacting the fluidic flow path having the first coating deposited thereon with a solution comprising an organosilane reagent of Formula II

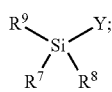
(II)

wherein:

R⁷, R⁸, and R⁹ are each independently selected from the group consisting of $C_1-C_6$ alkyl, $(C_1-C_6)$alkenyl, —NHR¹⁰, —NR¹⁰R¹¹, OH, OR¹⁰, and halo;

R¹⁰ and R¹¹ are each independently selected from $C_1-C_6$ alkyl;

Y is —$(C_1-C_6)$alkyl —OR¹², —[O$(C_1-C_3)$alkyl]$_{1-10}$O$(C_1-C_6)$alkyl, —[O$(C_1-C_3)$alkyl]$_{1-10}$OH or phenyl, wherein said $(C_1-C_6)$alkyl is substituted with one or more halo or one or more functional groups selected from the group consisting of OH, amino, $(C_1-C_6)$alkylamino, di$(C_1-C_6)$alkylamino, cyano, —C(O)NH$_2$, sulfonic acid, and carboxyl, and wherein said phenyl is optionally substituted with one or more groups selected from the group consisting of $(C_1-C_3)$alkyl, OH, halo, cyano, —C(O)NH$_2$, and carboxyl;

R¹² is —$(C_1-C_3)$alkyloxirane, —$(C_1-C_3)$alkyl-3,4-epoxycyclohexyl, or —$(C_1-C_4)$alkylOH;

to form a second coating on at least a portion of the wetted surface of the fluidic flow path, and in direct contact with the first coating.

2. The method of claim 1, wherein Z is $(C_2-C_{10})$alkyl.

3. The method claim 1, wherein Z is —(CH$_2$CH$_2$)—.

4. The method of claim 1, wherein R¹, R², R³, R⁴, R⁵, and R⁶ are each independently selected from the group consisting of $(C_1-C_2)$alkoxy, —N$((C_1-C_2)$alkyl$)_2$, and halo.

5. The method of claim 1, wherein R¹, R², R³, R⁴, R⁵, and R⁶ are each methoxy or are each chloro.

6. The method of claim 1, wherein the reagent of Formula I is bis(trichlorosilyl)ethane or bis(trimethoxysilyl)ethane.

7. The method of claim 1, wherein R⁷, R⁸, and R⁹ are each independently selected from the group consisting of —N[$(C_1-C_6)$alkyl]$_2$, $(C_1-C_6)$alkoxy, and halo.

8. The method of claim 1, wherein R⁷, R⁸, and R⁹ are each ethoxy, or are each dimethylamino.

9. The method of claim 1, wherein Y is —[O$(C_1-C_3)$alkyl]$_{1-10}$O$(C_1-C_6)$alkyl or —[O$(C_1-C_3)$alkyl]$_{1-10}$OH.

10. The method of claim 1, wherein Y is —[O$(C_1-C_3)$alkyl]$_{1-10}$O$(C_1-C_6)$alkyl.

11. The method of claim 1, wherein Y is —[O$(C_1-C_3)$alkyl]$_{1-10}$OH.

12. The method of claim 1, wherein the organosilane reagent of Formula II is 2-[methoxy(polyethyleneoxy)$_{6-9}$propyl]tris(dimethylamino)silane.

13. The method of claim 1, wherein the organosilane reagent of Formula II has the structure

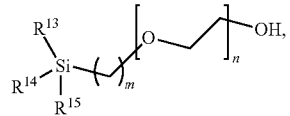

wherein:

m is an integer from about 1 to about 10;
n is an integer from about 2 to about 50; and
R₁₃, R₁₄, and R₁₅ are each ethoxy.

14. The method of claim 13, wherein m is 3 and n is from about 8 to about 12.

15. The method of claim 1, wherein the solution further comprises an aliphatic or aromatic organic solvent.

16. The method of claim 15, wherein the solvent is toluene.

17. The method of claim 1, further comprising removing any excess organosilane reagent following the contacting of the fluidic flow path with the solution comprising the organosilane reagent, removing comprising rinsing the fluidic flow path at least once with at least one solvent.

18. The method of claim 1, further comprising drying the fluidic flow path following the contacting of the fluidic flow path with the solution comprising the organosilane reagent, drying comprising exposing the fluidic flow path to an elevated temperature for a period of time.

19. The method of claim 1, further comprising hydrolyzing at least a portion of the first coating, the second coating, or both, the hydrolyzing comprising contacting the fluidic flow path with water.

20. The method of claim 1, further comprising annealing the first coating.

\* \* \* \* \*